United States Patent [19]
Itou

[11] Patent Number: 5,986,682
[45] Date of Patent: *Nov. 16, 1999

[54] RECORDING APPARATUS AND RECORDING METHOD

[75] Inventor: Hiroshi Itou, Tokyo, Japan

[73] Assignee: Mitsubishi Denki Kabushiki Kaisha, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/784,514

[22] Filed: Jan. 17, 1997

[30] Foreign Application Priority Data

Feb. 29, 1996 [JP] Japan ...................................... 8-43283

[51] Int. Cl.$^6$ .................................................... B41M 5/26
[52] U.S. Cl. ............................................................ 347/171
[58] Field of Search ..................................... 347/102, 200, 347/201, 212, 215, 218; 437/127; 399/122, 220, 320; 277/300

[56] References Cited

U.S. PATENT DOCUMENTS

| | | | |
|---|---|---|---|
| 4,517,590 | 5/1985 | Nagashima et al. | 358/75 |
| 5,252,988 | 10/1993 | Katayama et al. | 347/205 |
| 5,268,707 | 12/1993 | Katsuma et al. | 347/212 |
| 5,362,673 | 11/1994 | Iechi | 437/127 |
| 5,486,856 | 1/1996 | Katsuma et al. | 347/175 |
| 5,724,062 | 3/1998 | Hunter | 345/102 |

FOREIGN PATENT DOCUMENTS

| | | |
|---|---|---|
| 3506995 | 8/1986 | Germany . |
| 61-227067 | 10/1986 | Japan . |
| 62-055166 | 3/1987 | Japan . |
| 62-144026 | 6/1987 | Japan . |
| 63-274562 | 11/1988 | Japan . |
| 05124236 | 5/1993 | Japan . |
| 06013042 | 1/1994 | Japan . |
| 06225080 | 8/1994 | Japan . |

*Primary Examiner*—N. Le
*Assistant Examiner*—Anh T. N. Vo
*Attorney, Agent, or Firm*—Rothwell, Figg, Ernst & Kurz, p.c.

[57] ABSTRACT

A recording apparatus is provided with a housing for blocking off external light, a supporting base placed in the housing, and a plurality of heating elements, which are arranged on the supporting base in a direction of width of recording paper, for performing the color development of recording paper. The recording apparatus is further provided with a light emitting device, which is placed on the supporting base in such a way as to extent in a direction of width of recording paper, for coming near to recording paper and for fixing an image thereon, and a paper feeding mechanism, which is placed in the housing, for conveying recording paper onto the heating elements and the light emitting device. Thus, the recording apparatus can be miniaturized. Further, the reliability of the recording apparatus can be enhanced. Consequently, the maintenance of the recording apparatus can easily be maintained.

17 Claims, 41 Drawing Sheets

WAVELENGTH (nm)

WAVELENGTH (nm)

DIRECTIVITY CHARACTERISTICS

QUANTITY OF LIGHT

LAMP ELECTRODE PORTION    LAMP POSITION    LAMP ELECTRODE PORTION

RECORDING APPARATUS AND RECORDING METHOD

BACKGROUND OF THE INVENTION

1. Field of the Invention

The present invention generally relates to a recording apparatus for printing, for example, a lottery ticket, a bar code label, other kinds of tickets or the like, and more particularly to a recording apparatus which uses thermosensitive (namely, heat-sensitive or thermographic) paper of the optical-fixing type, on which color-development is performed by heat and further, an image is optically fixed.

2. Description of the Related Art

In recent years, thermal recording apparatuses using thermosensitive paper as recording paper have come into wide use as a simplified output device for use in a facsimile system or the like owing to the simplicity thereof. Such a recording apparatus has a structure, wherein thermosensitive paper is conveyed onto a plurality of heating elements that are placed and spread in a direction perpendicular to the direction in which the thermosensitive paper is conveyed, and wherein arbitrary ones of the heating elements placed therein are selected and energized simultaneously with the conveyance of the thermosensitive paper, and the color recording of an image is then performed by utilizing heat produced by the energized ones of the heating elements.

Such conventional recording apparatuses, however, have drawbacks in that after the recording is once accomplished, an uncolored part may be colored by heat originated from sunlight or may be chemically colored owing to the depositing of alcohol or the like thereon, namely, in that a recorded image may be tampered or deteriorated and cannot be well preserved. The thermosensitive paper used in such conventional recording apparatuses are, therefore, unsuited to recording media which are required to have high reliability and are used for a lottery ticket, a bar code label, other kinds of tickets or the like.

Meanwhile, for the purpose of solving the problems of preventing the color-redevelopment (or re-coloring) of thermosensitive paper and improving the preservability thereof, thermosensitive paper of the optical fixing type has been proposed by Fuji Photo Film Co., Ltd., and has been developed into a product that has already been on the market. This thermosensitive paper has been announced or described in detail in a reference material for a seminar held on May 31, 1995, by Technology Information Association, which is entitled "Thermo-Autochrome Full Color Recording Technology".

There are two kinds of methods for recording an image on this thermosensitive paper of the optical fixing type. A first method is to first selectively perform the color-development of the thermosensitive paper by heat and thereafter perform the optical fixing of colored and uncolored parts thereof by utilizing ultraviolet light. A second method is to first perform the color-development of the thermosensitive paper by selectively emitting light and thereafter perform the fixing and color-development thereof by heat. The fact, however, is that these methods have encountered various problems as will be described hereinbelow, and thus do not come into wide use.

FIGS. 60 and 61 are sectional diagrams for illustrating a conventional recording apparatus that employs this first method. As shown in these figures, a thermal head 1 is provided in a housing (not shown) of the recording apparatus. Further, a plurality of heating elements 2 are provided on the thermal head 1 in such a way as to be arranged in a line. Furthermore, recording paper, which is thermosensitive paper of the optical fixing type, is placed on the heating elements 2. The heating elements 2 are arranged in a direction perpendicular to the direction in which the thermosensitive paper is conveyed.

Furthermore, a circuit component configuration portion 6, in which circuit components for driving the heating elements 2 are placed, is provided on the thermal head 1. Further, a platen roller 4 for conveying recording paper is placed by being supported by the housing (not shown) in such a manner as to be opposed to the heating elements 2. The platen roller 4 is operative to feed the recording paper 5 to the left as viewed in FIG. 60. Moreover, a lamp 3 is disposed in front of the thermal head 1 in the direction of conveyance of the recording paper 5 in parallel with the heating elements 2. The lamp 3 constitutes a light emitting means for fixing an image on the recording paper.

In the conventional recording apparatus having such a configuration, the recording paper 5 is fed by the platen roller 4 on the thermal head 1. Further, only parts, on which the recording of image data is performed by selectively driving arbitrary heating elements 2, of the recording paper 5 are colored by heat. Subsequently, when the recording paper 5 passes through the vicinity of the lamp 3, an image is fixed on the recording paper 5 by light emitted from the lamp 3.

The lamp 3 is driven at a high voltage of several hundreds volts and generates heat at a high temperature. Therefore, when the recording paper 5 approaches the lamp 3, the color-redevelopment occurs owing to the temperature of the lamp 3 before the optical fixing of an image is performed on the recording paper 5. In this case, the recording of the image is impossible. Thus, in the conventional recording apparatus, a predetermined spacing L between the lamp 3 and the recording paper 5 should be left or allowed so as to prevent the recording paper 5 from being colored owing to heat radiated from the lamp 3.

Further, FIG. 62 is a top view of the conventional recording apparatus that is in a state in which the platen roller 4 is removed therefrom. This figure illustrates the placement of the thermal head 1 and the lamp 3 in the recording apparatus. As illustrated in this figure, the lamp 3 has a width that is considerably wide in comparison with the width of the arrangement array or line of the heating elements 2 of the thermal head 1 and with the width of the recording paper 5. This is owing to the electrode structure of the lamp 3. Namely, the drive electrode terminals thereof are drawn from both edges of the lamp 3, respectively. Thus, the lamp 3 has a same structure as of a fluorescent lamp using an ordinary alternating-current power source.

FIG. 63 is a graph for illustrating the distribution of quantity of light (or the luminous energy distribution) of the lamp 3 of the conventional recording apparatus. As is seen from this figure, the quantity of light is low at each of the electrode portions of the lamp 3 and does not come up to the fixing quantity of light (namely, the quantity of light required for fixing or fixation). Therefore, if the apparatus is established in such a manner that the fixing quantity of light is obtained throughout the width of the recording paper 5, the lamp 3 should have a length longer than the width of the recording paper 5. Incidentally, in the case of the recording paper, whose width is equal to that of an A4 page, the width of the lamp 3 should be equal to that of an A3 page or so.

FIG. 64 is a diagram for illustrating operations of opening and closing the cover of another example of the conventional recording apparatus. Further, FIG. 65 is a diagram for illustrating the placement of components in this recording apparatus. As shown in these figures, a housing 120 of the recording apparatus consists of a chassis 122 and an open/close cover 121 attached to the chassis 122. The cover 121 is opened when changing the recording paper 5 enclosed in the housing 120, and when replacing a recording head 123.

In the housing 120, the recording paper 5 wound like a roll is enclosed and the thermal head 1 for recording an image on the recording paper 5 is placed. Further, the conveying platen roller 4 is placed in such a manner as to face the thermal head 1. The thermal head 1 is pushed by a spring 128 to the conveying platen roller 4.

Furthermore, an optical detection sensor 126 for detecting the recording paper 5, and another optical detection sensor 127 for detecting the opened and closed states of the cover 121 are placed in the housing 120.

In the case of the conventional recording apparatus having such a configuration, because of the necessity of the predetermined spacing L between the lamp 3 and the recording paper 5, the thermal head 1 and the lamp 3 are supported by different members (not shown), respectively. Further, the presence of the spacing L between the thermal head 1 and the lamp 3 sometimes causes the recording paper 5 to jam therebetween.

Meanwhile, for the purpose of realizing a mechanism by which a paperjam is hard to occur, there has been contrived a method of increasing the spacing L between the lamp 3 and the recording paper 5, as illustrated in FIG. 66. However, when increasing the spacing L, the lamp 3 goes away from the recording paper 5 this time. Thus, there is caused another problem that the quantity of light required to achieve the fixing cannot be obtained.

Additionally, when increasing the quantity of light emitted from the light source by raising a source voltage for driving the lamp 3, significant degradation in quantity of light due to the use of the lamp 3 is caused. Consequently, this results in occurrence of still another problem that the life of the lamp 3 is reduced.

This is owing to the electrode structure of the lamp 3, namely, to the fact that the drive electrode terminals are drawn from both edges of the lamp 3, respectively, and that the lamp 3 has a same structure as of a fluorescent lamp using an ordinary alternating-current power source.

Moreover, as above described, in the case of the conventional recording apparatus, the length of the lamp 3 should be larger than the width of the recording paper 5. This method, thus, has faced the problem that a reduction in size of the recording apparatus cannot be achieved.

Furthermore, an optical detection sensor 126 for detecting the recording paper 5, and another optical detection sensor 127 for detecting the opened and closed states of the cover 121 are placed in the housing 120. Thus, the number of components provided in the housing 120 is large. Further, the structure of the apparatus is complex.

Meanwhile, even when a recording operation is failure owing to a failure or defect of the heating elements 2, a sustain on the recording paper, oblique feeding of the recording paper, a break of the recording paper and so forth, there are no effective detecting means and thus no reliability of the recording cannot be obtained. The conventional recording apparatus, therefore, has a drawback in that record information output cards (or tickets), to which a record of money information concerning a lottery ticket, a bar code or other kinds of tickets is outputted, cannot be used because of the fact that there is no reliability of the record.

Furthermore, when failures or malfunctions of the heating elements 2 and the lamp 3 occur, such components provided in the recording apparatus cannot easily be replaced. Further, it is difficult for persons other than engineers (for example, a seller of lottery tickets and a station employee) to replace such a component. Thus, the conventional recording apparatus has a defect in that the maintenance thereof is difficult.

The present invention is accomplished to solve the problems (namely, eliminate the drawbacks) of the prior art.

It is, accordingly, an object of the present invention to provide a recording apparatus which can be miniaturized and can enhance the reliability thereof and can easily achieve the maintenance thereof.

SUMMARY OF THE INVENTION

To achieve the foregoing object, in accordance with an aspect of the present invention, there is provided a recording apparatus (hereunder sometimes referred to as a first recording apparatus) that comprises: a housing for blocking off external light; a supporting base provided in the housing; a plurality of heating elements, arranged on the supporting base in a direction of width of recording paper, for coloring (namely, performing the color development of) recording paper; light emitting means, placed on the supporting base in such a way as to extent in a direction of width of recording paper, for coming near to recording paper and for fixing an image thereon; and a paper feeding mechanism, placed in the housing, for conveying (or feeding) recording paper onto the heating elements and the light emitting means.

Thus, the integration of the electronic components can be achieved. Consequently, the size of the recording apparatus can be reduced. Moreover, the replacement of a component in the recording apparatus can be facilitated.

In the case of an embodiment (hereunder sometimes referred to as a second recording apparatus) of the first recording apparatus, the light emitting means is a light emitting diode.

Thus, the width of a light source may be equal to that of recording paper. Thus, the miniaturization of the recording apparatus can be achieved. Further, the spacing between the light emitting device or element 8 and the recording paper can be reduced. Therefore, the size of the recording apparatus can be decreased. Moreover, the conveyance of the recording paper can be performed by maintaining the planar state of the recording paper. Thus, no paper jam can occur. Furthermore, the quantity of light required for fixing can be small. Consequently, the deterioration life of the light source can be increased.

In the case of an embodiment (hereunder sometimes referred to as a third recording apparatus) of the first recording apparatus, the light emitting means is composed of: a sealed container, a surface of which is a glass plate; a pair of electrodes placed on an inner surface of the glass plate of the sealed container; and a fluorescent element provided in the container in such a way as to face the glass plate, wherein the container is filled with inert mixed gas, wherein the light emitting means is placed in such a manner that the glass plate thereof faces recording paper.

Thus, the quantity of light can easily be made to be uniform. Further, the conveyance of recording paper can easily be performed, because of the flatness of a light emitting surface. Moreover, there is no necessity of using mercury which is difficult to treat.

In the case of an embodiment (hereunder sometimes referred to as a fourth recording apparatus) of the first recording apparatus, wherein the supporting base is produced by using an aluminum material through an extruding process, wherein the supporting base has a groove extending in the direction of width of recording paper, wherein the light emitting means is a lamp put in the groove.

Thus, the lamp can be restrained from emitting heat. Thereby, the distance between the lamp and the recording paper can be made to be smaller than that in the case of the conventional recording apparatus. Moreover, the conveyance of the recording paper can be performed by maintaining the planar state of the recording paper. As a result, no paper jam can occur. Furthermore, as a consequence of making the supporting base by performing the extruding process, the base having a sectional shape like a round groove, which is hard to process from the top surface thereof, can easily be realized.

Further, an embodiment (hereunder sometimes referred to as a fifth recording apparatus) of the second recording apparatus further comprises: a guide member provided on the supporting base; a substrate mounted on the supporting base in such a way as to be able to be guided by the guide member and move in a direction perpendicular to a direction in which recording paper is conveyed or fed; and a moving mechanism, mounted on the supporting base, for moving the substrate in a reciprocative manner in a direction in which recording paper is conveyed or fed.

Thus, the variation in quantity of light due to the clearance between the light emitting means can be eliminated. Consequently, the fabrication of a light emitting board (or substrate) can be facilitated. Moreover, the arrangement pitch or interval can be increased. Thereby, the light emitting means can be decreased in quantity. Consequently, the cost of the recording apparatus can be reduced.

Moreover, in the case of an embodiment (hereunder sometimes referred to as a sixth recording apparatus) of the second or fifth recording apparatus, the light emitting diode is a light emitting diode using a SiC substrate.

Thus, the price of this light emitting diode is lower than that of other blue light emitting diodes.

In the case of an embodiment (hereunder sometimes referred to as a seventh recording apparatus) of the second, fifth or sixth recording apparatus, the driving potential of the light emitting diode is equal to that of each of the heating elements.

Thus, the number of electrical connections can be decreased. Further, a high-voltage power supply can be shared. Consequently, the efficiency in using the power supply of the recording apparatus can be enhanced.

In the case of an embodiment (hereunder sometimes referred to as an eighth recording apparatus) of one of the first to seventh recording apparatuses, a transparent (or translucent) plate is placed between the light emitting means and the recording paper.

Thus, the conveyance of the recording paper can be facilitated by feeding the recording paper on the transparent plate.

Furthermore, an embodiment (hereunder sometimes referred to as a ninth recording apparatus) of one of the first to eighth recording apparatuses further comprises: a plurality of light receiving elements arranged in the direction of width of recording paper in front of the heating elements in a direction in which recording paper is conveyed or fed; and a interpreting (or reading) device electrically connected to the light receiving elements.

Thus, a result of recording, which is fixed on recording paper, is read by the light receiving element. Consequently, the reliability of the recording apparatus can be enhanced.

In the case of an embodiment (hereunder sometimes referred to as a tenth recording apparatus) of one of the first to ninth recording apparatuses, a condensing or collecting member is placed between the light emitting means and recording paper.

Thus, the emitted light can be condensed or collected onto the surface of recording paper. Consequently, the quantity of light required for fixing can be utilized effectively.

In the case of an embodiment (hereunder sometimes referred to as an eleventh recording apparatus) of one of the first to tenth recording apparatuses, wherein the housing has an opening at a place where recording paper is able to be visually checked, wherein a filter for blocking off at least light, whose wavelength is an absorption wavelength of recording paper, is provided at the opening.

Thereby, the remaining quantity of recording paper wound like a roll can be visually checked.

In the case of an embodiment (hereunder sometimes referred to as a twelfth recording apparatus) of one of the ninth recording apparatuses, wherein an arrangement pitch of the plurality of light receiving elements is not more than an arrangement pitch of the plurality of heating elements.

When fabricating the apparatus, a maker has only to pay attention to the arrangement of the elements in such a way that the line of the light receiving elements becomes parallel to the arrangement line of the heating elements. Thereby, the fabrication of the apparatus can be facilitated.

In the case of an embodiment (hereunder sometimes referred to as a thirteenth recording apparatus) of one of the ninth or twelfth recording apparatuses, wherein it is detected by the light receiving elements whether or not recording paper is present.

Thus, a recording-paper detecting device can be removed from the prior art apparatus. Consequently, the number of components of the recording apparatus can be decreased. Thereby, the cost of the apparatus can be reduced.

In the case of an embodiment (hereunder sometimes referred to as a fourteenth recording apparatus) of one of the ninth, twelfth or thirteenth recording apparatuses, wherein it is detected by the light receiving elements whether the housing is opened or closed.

Thus, a device, which is used for detecting whether the housing is opened or closed, can be removed from the prior art apparatus. Consequently, the number of components of the recording apparatus can be decreased. Thereby, the cost of the apparatus can be reduced.

In accordance with another aspect of the present invention, there is provided a recording apparatus (hereunder sometimes referred to a fifteenth recording apparatus) that comprises: a housing for blocking off external light; a supporting base provided in the housing; a plurality of heating elements, arranged on the supporting base in a direction of width of recording paper, for coloring (namely, performing the color development of) recording paper; a laser diode placed in the housing; a reflection plate, placed in the housing, for reflecting light emitted from the laser diode and for scanning recording paper with the reflected light in a direction of width of the recording paper; and a paper feeding mechanism, placed in the housing, for conveying (or feeding) recording paper onto the heating elements and the light emitting means.

Thus, it is sufficient to provide a single light emitting device 130 in the apparatus as a light source or supply. Consequently, the cost of the apparatus can be reduced. Further, recording paper is irradiated with light condensed by a light slit plate 131. Thereby, the recording resolution can be raised.

In accordance with still another aspect of the present invention, there is provided a recording method (hereunder sometimes referred to a first recording method) having the steps of: conveying (or feeding) recording paper to a vicinity of a heating element and a proximity of light emitting means by use of a paper feeding mechanism; and coloring (or performing the color development of) the recording paper by heat produced by the heating element and by light emitted from the light emitting means. The first recording method further comprises the step of: causing the recording paper to perform a reciprocative motion in the proximity of the light emitting means after selectively driving the heating element.

Thus, a period time, in which recording paper is conveyed in the vicinity of the light emitting means, can be lengthened in the case when light is emitted from the light emitting means. Thereby, a larger quantity of light required for fixing can be gained. Consequently, a lack or shortage of a quantity of light emitted from the light emitting device can be made up for.

In accordance with still another aspect of the present invention, there is provided another recording method (hereunder sometimes referred to a second recording method) also having the steps of: conveying (or feeding) recording paper to a vicinity of a heating element and a proximity of light emitting means by the use of a paper feeding mechanism; and coloring (or performing the color development of) the recording paper by heat produced by the heating elements and by light emitted from the light emitting means. The second recording method further comprises the step of: controlling the heating element and the light emitting means by using a single power supply as both of a drive power supply for the heating element and a drive power supply for the light emitting means, in such a manner that when one of the heating element and the light emitting means is driven, the other of the heating element and the light emitting means is not driven.

Thus, the efficiency in using the power supply of the recording apparatus can be enhanced.

BRIEF DESCRIPTION OF THE DRAWINGS

Other features, objects and advantages of the present invention will become apparent from the following description of preferred embodiments with reference to the drawings in which like reference characters designate like or corresponding parts throughout several views, and in which.

DETAILED DESCRIPTION OF THE PREFERRED EMBODIMENTS

Hereinafter, the preferred embodiments of the present invention will be described in detail by referring to the accompanying drawings.

EMBODIMENT 1

Figure 1:
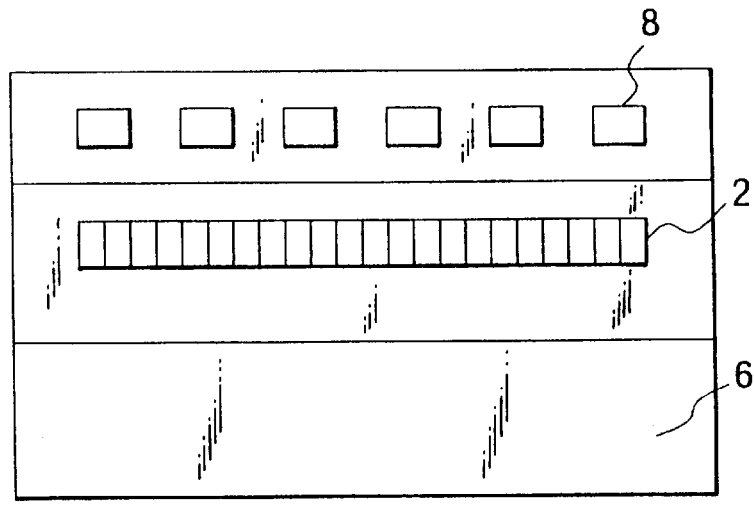
FIG. 1 is a plan view of a primary part of a recording apparatus of the present invention.
Figure 2:
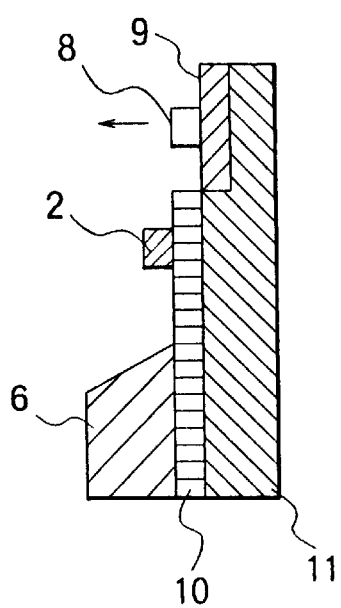
FIG. 2 is a sectional view of the recording apparatus of FIG. 1.

FIG. 1 is a plan view of a primary part of a recording apparatus of the present invention. FIG. 2 is a sectional view of the recording apparatus of FIG. 1. As shown in these figures, a plurality of heating elements 2 are arranged in a line on a heating element board or element 10 in a direction perpendicular to the direction in which recording paper (not shown) is conveyed, similarly as in the case of the prior art.

Furthermore, a circuit component configuration portion 6, in which circuit components for driving the heating elements 2 are placed, is provided on the heating element board 10. Further, light emitting devices or elements 8 are disposed on the heating element board 9 in such a manner as to be in parallel with the arrangement line of the heating elements 2. Moreover, the heating element board 10 and a light emitting board 9 are fixedly mounted on a supporting base 11 in such a way as to be integral with each other. The light emitting devices constitute a light emitting means for fixing an image on the recording paper.

In the case of the recording apparatus of this embodiment, recording paper (not shown) is conveyed from the lower part to the upper part of FIG. 1 by a paper feeding mechanism (to be described later). Further, the recording paper is first selectively colored by heat emitted from the heating elements 2. Thereafter, colored parts and uncolored parts are fixed thereon by light emitted from the light emitting elements 8.

Figure 3:
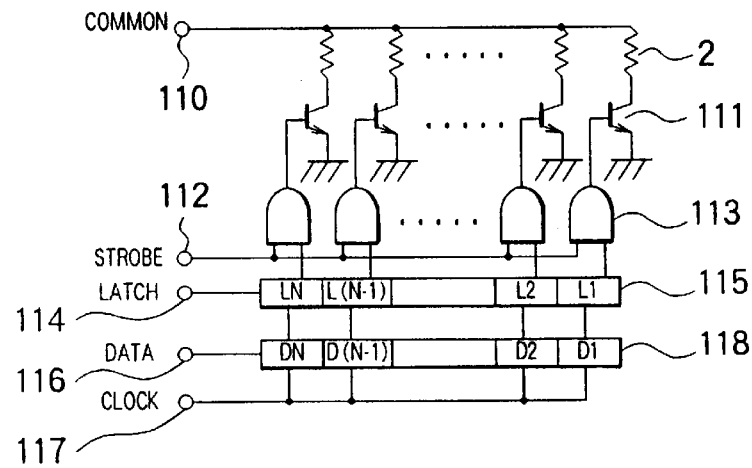
FIG. 3 is a circuit diagram for illustrating the configuration of a circuit for driving and energizing heating elements.

FIG. 3 is a circuit diagram for illustrating the configuration of a circuit for driving and energizing a plurality of heating elements 2. As shown in this figure, a voltage for driving the heating elements 2 is applied to a COMMON terminal 110 to which a terminal of each of the heating elements 2 is connected. Further, a switching device or element 111 is connected to the other end of each of the heating elements 2. A switching operation of this switching element 111 is performed according to information outputted from an AND circuit 113 connected to the switching element 111.

An input terminal of each AND circuit 113 is connected to a STROBE signal terminal 112 from which a switching time determination signal is inputted. Further, the other input signal (terminal) of each AND circuit 113 is connected to an output signal terminal of a memory circuit 115. Incidentally, the memory circuit 115 is a circuit to which drive data for driving the heating element 2 is inputted and in which the inputted drive data is held. Further, a data holding operation of the memory circuit 115 is performed in response to the inputting of a timing signal from a LATCH signal terminal 114.

Moreover, shift registers 118 of the number, which is equal to that of the heating elements 2, are connected to the memory circuit 115. Furthermore, a DATA signal terminal 116, from which serial signals representing heating-element driving data is connected or attached to the shift registers 118. Additionally, a CLOCK signal terminal 117, from which clock signals for synchronizing driving data signals with serial signals is connected to each of the shift register circuits 118.

In the circuit of FIG. 3, an operation of selectively driving the heating elements 2 is performed as follows. Namely, first, serial heating element driving data is inputted from the DATA signal terminal 116. Then, the serial heating element driving data is inputted to the shift register circuit 118 in synchronization with a synchronization clock signal inputted from the CLOCK signal terminal 117. Subsequently, when inputting a signal from the LATCH signal terminal 114, the data held in the shift registers 118 is transferred to the memory circuit 115 by detecting, for example, a trailing edge of the signal. Thereafter, when a signal having a high signal level "H" is inputted from the STROBE signal terminal 112, the switching element 111 is switched according to the heating element driving data held in the memory 115 for a time period in which the STROBE signal has the level "H". Finally, the heating element 2 connected to this switching element 111 is driven.

Figure 4:
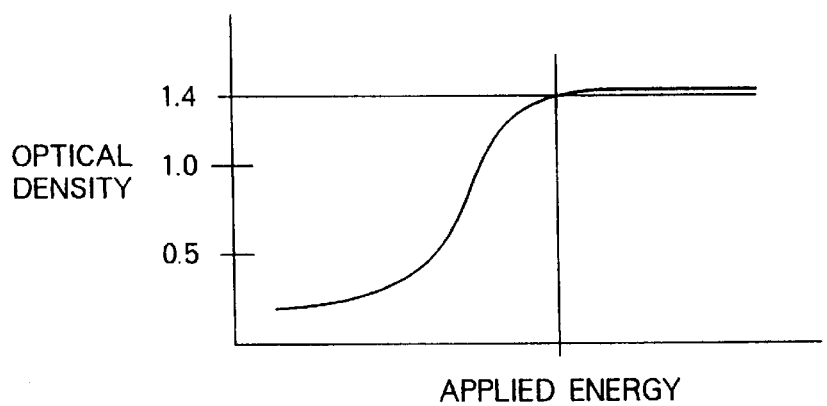
FIG. 4 is a graph for illustrating the relation between energy applied to the heating elements and the optical density of recording paper.

FIG. 4 is a graph for illustrating the relation between energy applied to the heating elements 2 and the optical density of recording paper 5. In this figure, the horizontal axis represents the applied energy which corresponds to the time period in which the signal inputted from the STROBE signal terminal 112 has the level "H". When the record coloring density of the recording paper is about 1.4, "black" can be recognized. Therefore, the energy applied to the heating elements 2, which corresponds to the optical density of 1.4 on the surface of the recording paper, is one measure or reference of the applied energy. Further, when selectively driving the heating elements 2, a time period required to color (or achieve the color development) is a time required to obtain the optical density of 1.4.

A part of the thermosensitive paper of the optical fixing type, which corresponds to an unselected one of the heating elements 2, has the optical density of 0.6 or so and is colored in almost yellow. In the case of the thermosensitive recording paper of the optical fixing used in this embodiment, parts to be recorded in black are colored in black by selectively driving the heating elements. Thereafter, the parts colored in black are fixed by irradiating light. In addition, yellow parts, which are, namely, not colored in black, are discolored, namely, the color thereof is changed into white, and then such parts are fixed.

Figure 5:
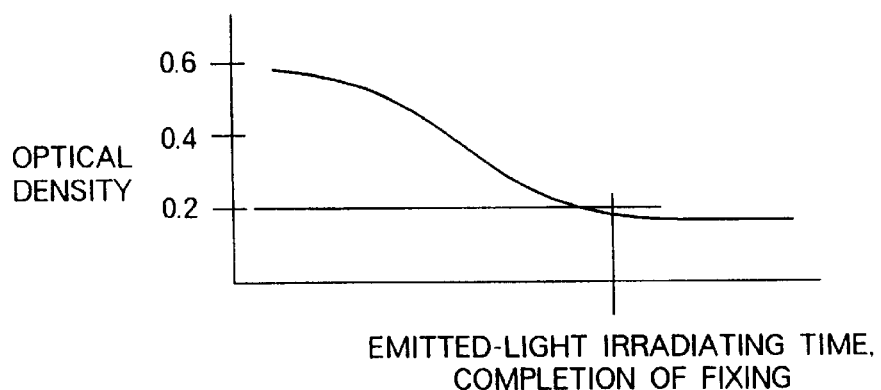
FIG. 5 is a graph for illustrating the relation between an emitted-light irradiating time for fixing and the optical density of recording paper.

FIG. 5 is a graph for illustrating the relation between an emitted-light irradiating time for fixing and the optical density of the recording paper. In this figure, a point, at which the optical density of the recording paper becomes not less than 0.2 or so, is a point where the fixing of a record or image on the recording paper is finished. Therefore, a time period from the start of fixing to the completion of fixing is an emitted-light irradiating time required to fix the record or image on the recording paper. Incidentally, the optical density of 0.2 is that of a white ground (or background) of usually used plain paper.

In this way, the fixing and recording of an image and so forth are performed on the recording paper 5 by selectively driving the heating elements 2 in such a manner as to achieve the coloring at the optical density of 1.4 or so on the recording paper 5 by the use of the heating elements 2 and by irradiating light energy on the recording paper 5 by the use of the light emitting elements 8 in such a manner that the optical density thereon is 0.2 or so. Incidentally, in the foregoing description of this embodiment, the drive circuit of FIG. 3 for driving the heating elements 2 has been described. The circuit and signal logic, however, are not limited to this circuit of FIG. 3.

Figure 6:
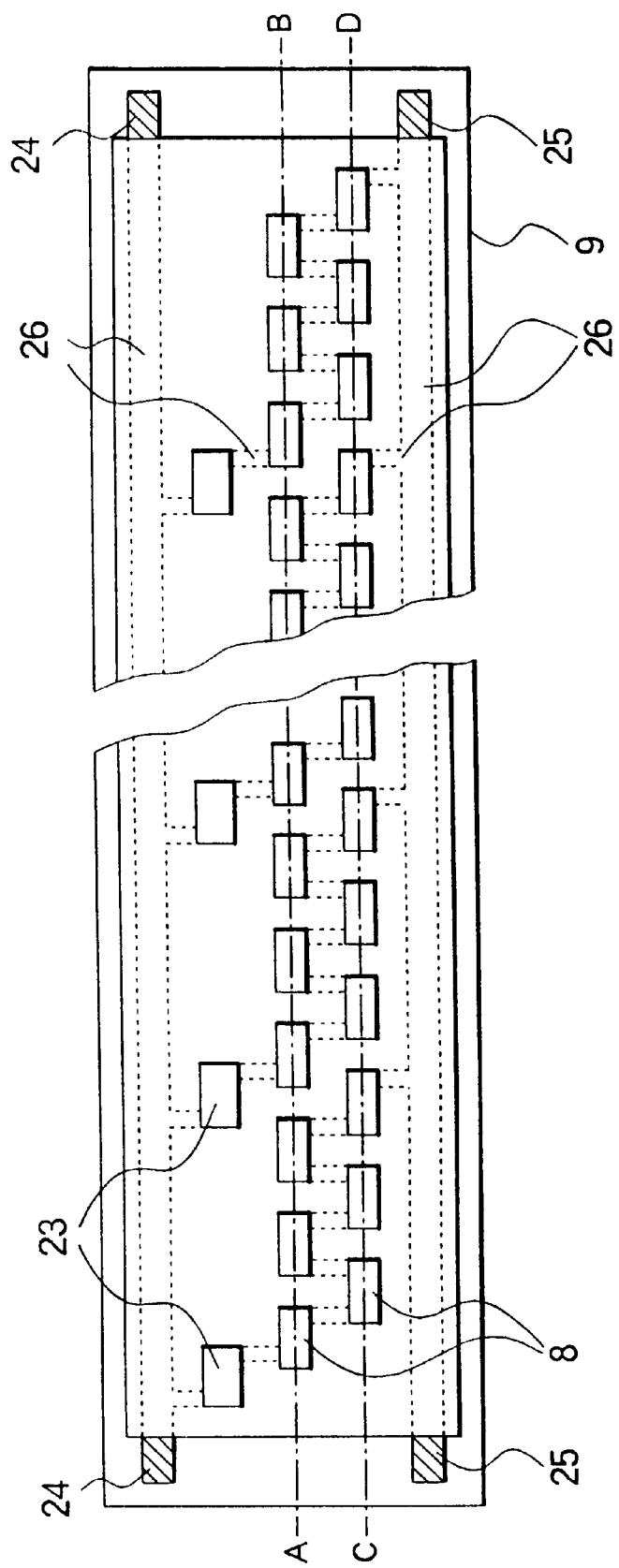
FIG. 6 is a diagram for illustrating the shapes of a light emitting board and light emitting devices arranged thereon in detail.
Figure 7:
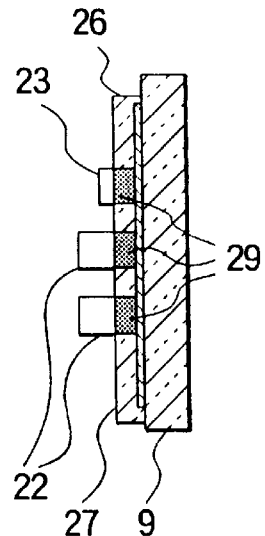
FIG. 7 is a sectional view of the light emitting board and the light emitting devices of FIG. 6.

FIGS. 6 and 7 illustrate the shapes of the light emitting board 9 and the light emitting devices or elements 8 arranged thereon in detail. As shown in FIG. 6, the light emitting devices 8 are placed in a staggered arrangement on the light emitting board 9 which is a printed circuit board made of a glass epoxy material. Practically, the light emitting devices 8 are light emitting diodes. Further, chip resistors 23, which are connected in series with the light emitting devices 8, respectively, and adapted to be soldered, are placed on the light emitting board 9. The chip resistors 23 are those used to limit an energizing current for the light emitting device 8. Moreover, a positive electrode terminal 24, which serves as a driving power supply terminal for the light emitting device or element 8, and a GND electrode terminal 25 of the light emitting device 8 are placed on the light emitting board 9. Furthermore, the light emitting devices 8, the chip resistors 23, the positive electrode terminal 24 and the GND electrode terminal 25 are electrically connected through a conductive pattern 26.

Further, the surface of the light emitting board 9 is coated with a solder resist 27 which is used to cover the conductive pattern 26 and has an insulating property. The light emitting devices 8 and the chip resistors 23 are soldered to the conductive pattern 26 with solder 29. The light emitting devices 8 are arranged in two lines, namely, an arrangement line A-B and another arrangement line C-D.

Figure 8:
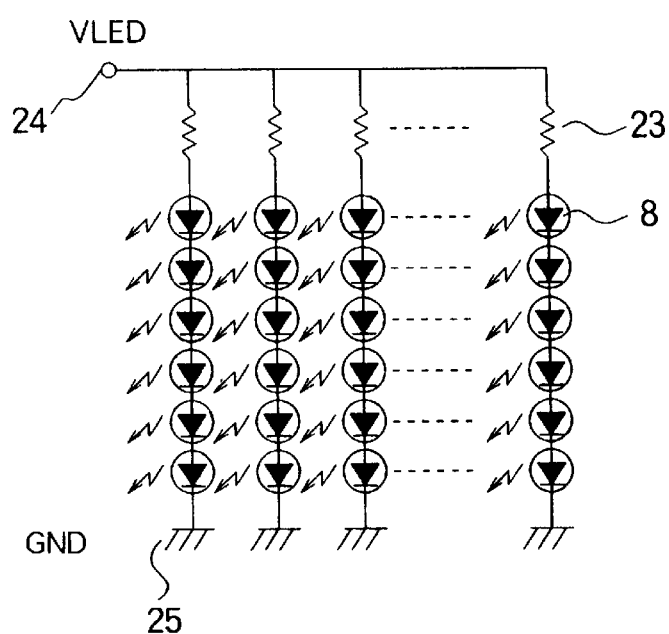
FIG. 8 is a diagram for illustrating an equivalent circuit of the light emitting board.
Figure 9:
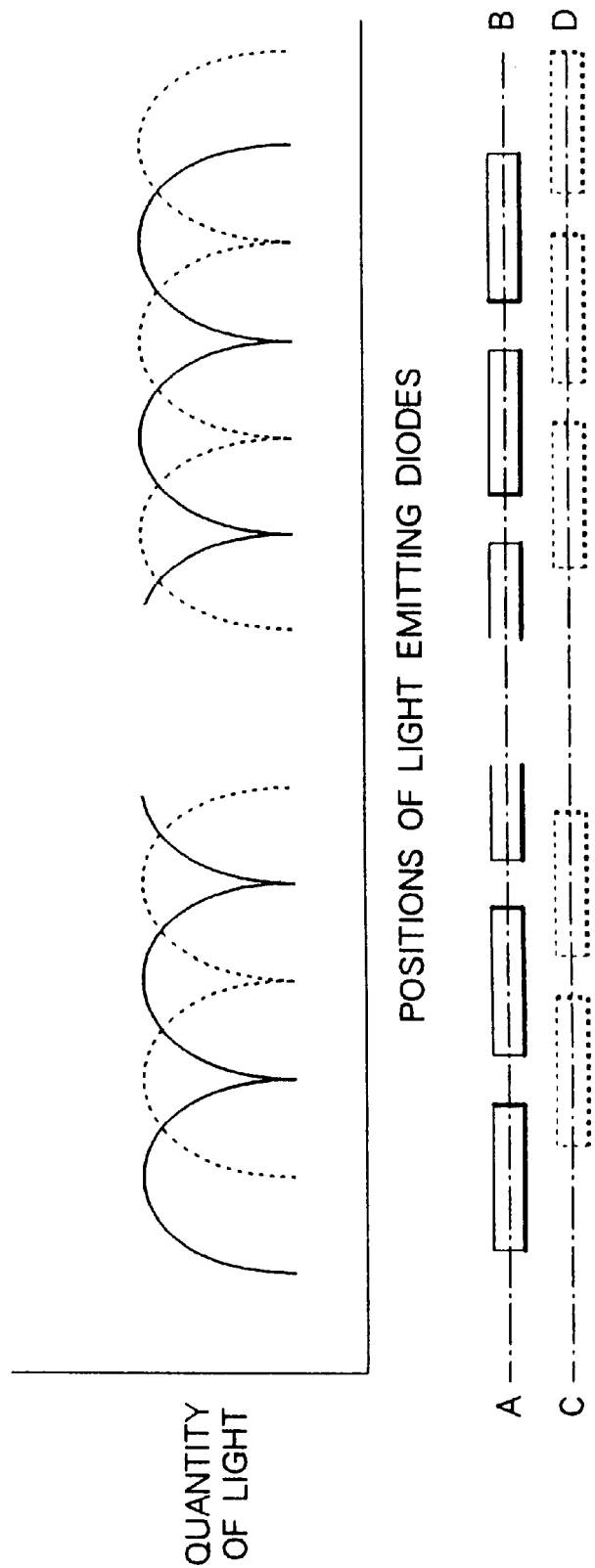
FIG. 9 is a graph for illustrating the relation between the quantity of emitted light and each of the positions of the light emitting devices arranged on the light emitting board.

A diagram of an equivalent circuit of the light emitting board is illustrated in FIG. 8. Further, FIG. 9 is a graph for illustrating the relation between the quantity of emitted light and each of the positions of the light emitting devices 8 arranged on the light emitting board 9. In FIG. 9, solid curves represent the distribution of the quantity of light on the arrangement line A-B of the light emitting devices 8; and dotted curves the distribution of the quantity of light on the arrangement line C-D of the light emitting devices 8. As is seen from FIG. 9, the quantity of light is uniform in the direction of width of recording paper owing to the staggered arrangement of the light emitting devices 8. Moreover, because the quantity of light required for fixing is obtained even at the edges of the light emitting board 9 by using the light emitting devices 8, the width of the light source, namely, the width of the light emitting board 9 can be made to be a width of the order of that of recording paper.

Further, an electric current for energizing the light emitting devices 8 is limited to 20 milliamperes or so. Therefore, the quantity of heat emitted therefrom is small in comparison with the lamp of the conventional apparatus. Moreover, heat emitted from the light emitting board 9, which is loaded with the light emitting devices 8, is dissipated from the supporting base 11 and becomes then very low. Thereby, the recording paper 5 can be placed nearer to the light emitting devices 8. Furthermore, as a result, the spacing between the recording paper and the lamp, which is needed in the case of the conventional recording apparatus, is unnecessary. Consequently, the conveyance of the recording paper can be performed by maintaining the planar state of the recording paper. Incidentally, if the quantity of the fixing light is insufficient even in the case of using the aforementioned staggered arrangement of the light emitting devices, another arrangement line of the light emitting devices 8 should be added in the direction in which the recording paper is conveyed.

Figure 10:
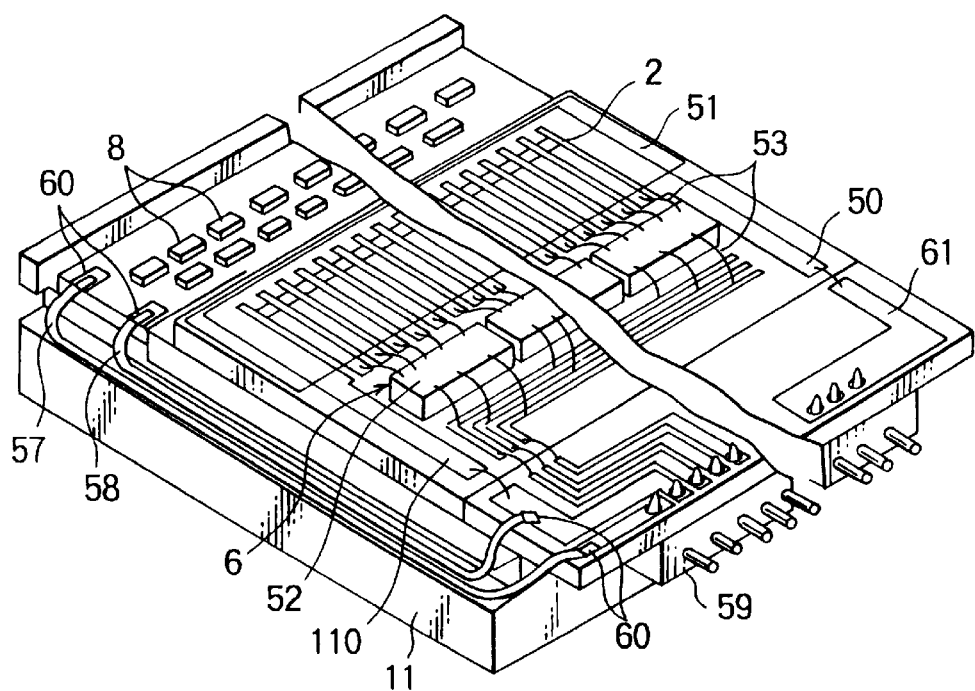
FIG. 10 is a perspective diagram for illustrating a primary part of the recording apparatus of the present invention in detail.

FIG. 10 is a perspective diagram for illustrating a primary part of the recording apparatus of the present invention in detail.

Figure 11:
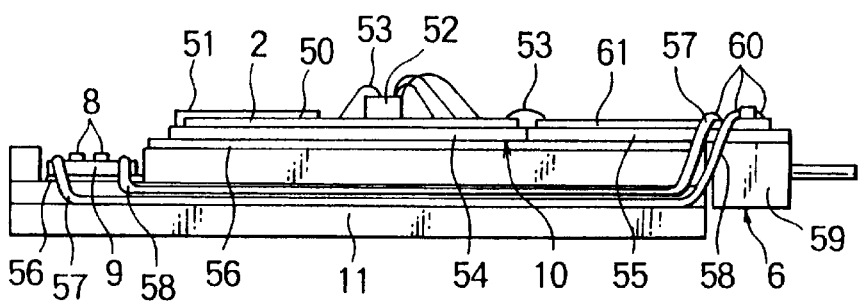
FIG. 11 is a side view of the primary part of the recording apparatus of FIG. 10.

FIG. 11 is a side view of the primary part of the recording apparatus of FIG. 10. As shown in FIG. 10, the light emitting board 9 is constituted by, for example, a glass epoxy board or substrate, on which the light emitting devices 8 are arranged as above described. Further, a plurality of electronic components such as the heating elements 2 are placed on a ceramic board 54, on which, for instance, a glass layer having a thickness of 50 microns (or so is deposited. Moreover, such electronic components are connected with one another through, for example, an aluminum conductive pattern 50 having a thickness of 1 or so, which is shaped in a desired pattern by the application of photoengraving etching techniques thereto after formed in film form by a vacuum film forming apparatus utilizing, for instance, a sputtering technique. Furthermore, for the purpose of protecting the heating elements 2 and the conductive pattern 50 from abrasion caused when feeding the recording paper 5, the electronic components are coated with a protective coat 51 which is deposited thereon by using a vacuum film forming apparatus utilizing, for example, a sputtering technique and is made of, for instance, SiO2, Ta2O5 or the like.

Additionally, an integrated-circuit (IC) chip 52, which contains a circuit for driving the heating elements 2, is placed on the ceramic board 54. Furthermore, the IC chip 52, the conductive pattern 50 and so forth are bonded to one another through gold wires 53 by wirebonding. Incidentally, the ceramic board 54 has requirements such as predetermined planarity, heat resistance and heat reserving characteristics, which are required for placing the heating elements 2 and forming the conductive pattern 50 and the protective coat 51 thereon.

The IC chip 52 and the conductive pattern 50 and so forth provided on the ceramic board 54 are electrically connected with one another through a print board 55. The ceramic board 54 and the print board 55 compose the heating element board 10.

The ceramic board 54, the print board 55 and the light emitting board 9 are fixed to the supporting base 11 with pressure sensitive adhesive double coated tape 56 having a thickness of 50 or so. Further, the light emitting diodes serving as the light emitting devices 8 are connected with a drive power supply through a positive power supply lead 57 and are grounded through a GND lead 58. Moreover, a connector 59 is provided at an end or edge portion of the print board 55. Furthermore, the electronic components or parts of FIG. 10 are electrically connected to an external circuit through this connector 59. Additionally, the heating elements 2 and the light emitting devices 8 are driven in response to a drive signal inputted from the connector 29.

Further, a conductive pattern 61, which is formed by plating a copper pattern with nickel or gold, is provided on the print board 55. Moreover, the connector 59, the positive power supply lead 57 and the GND lead 58 are fixedly connected to the conductive pattern 61. Incidentally, these components, namely, the IC chip 52, the print board 55 and the connector 59 compose the circuit component configuration portion 6. Furthermore, the electronic components of FIG. 10 are provided in a housing (not shown). Incidentally, the heating element driving circuit provided in the IC chip 52 is the same as illustrated in FIG. 7. The light emitting device circuit is the same as illustrated in FIG. 8.

Meanwhile, generally, the driving voltage for driving the heating elements 2 is controlled according to the withstand voltage of the IC chip 52 and the allowable current flowing therethrough. Thus, from the viewpoints of the technique and price, the maximum (allowable) voltage thereof is 30 volts (V) or so. Further, the driving voltage for driving the light emitting diode depends on the forward voltage of the diode and is several tens volts in the case that several light emitting diodes are connected in series. Moreover, the driving voltage for driving the light emitting diode can be adjusted to the driving voltage driving the heating element 2 by regulating the number of light emitting diodes connected in series and further regulating the limiting resistor or the like. Furthermore, conversely, the driving voltage for driving the heating element 2 can be changed by regulating the resistance of the heating element 2 in such a way that the driving voltage for driving the heating element 2 is matched with the driving voltage for driving the light emitting diode.

Figure 12:
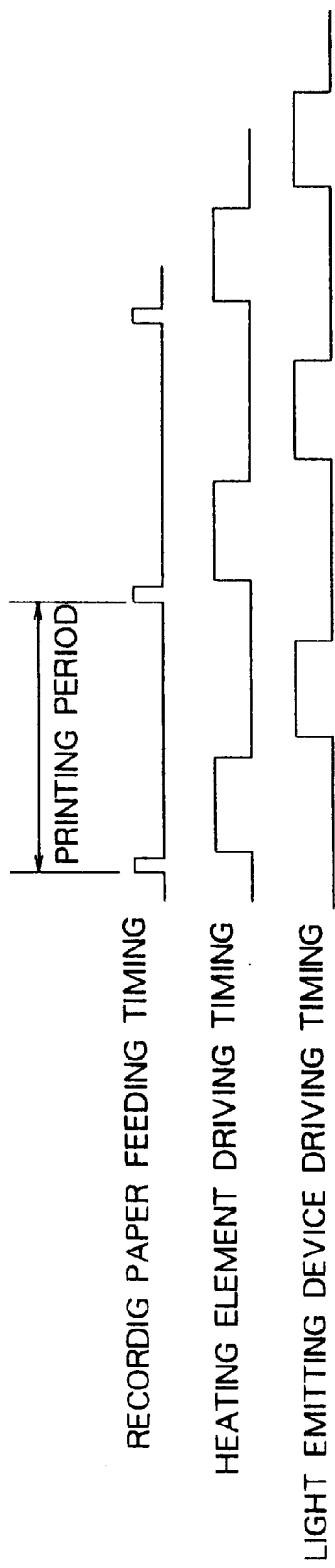
FIG. 12 is a timing chart for illustrating the timing of driving the heating elements and the light emitting device and the timing of feeding or conveying recording paper.

As illustrated in FIG. 10, the COMMON terminal 110, to which terminals provided on the same side of the heating elements 2 are connected in common, is connected to the positive power supply lead 57 of the light emitting device 8 through the conductive pattern 61. Further, such a terminal and this lead are connected with a same terminal. Moreover, regarding the grounding, the ground for driving the heating elements 2 and the ground for driving the light emitting devices 8 are connected to a same terminal. Namely, the heating elements 2 and the light emitting devices 8 are connected to the same power supply terminal and share the same power supply. As a result of the commonality of this driving power supply, the number of connection connector portions of the electronic components can be reduced to one. Incidentally, the power supply can be utilized further effectively if the driving voltage for driving the light emitting devices 8 is used in common as the driving voltage for driving the heating elements 2 and the timing of driving the light emitting devices 8 and the heating elements 2 is controlled in such a manner that the driving of the light emitting devices 8 is not performed simultaneously with that of the heating elements 2. Practically, the power supply can be effectively utilized if the moment, at which the heating elements 2 are driven, (corresponding to a moment at which the signal level of the STROBE signal becomes "H") is shifted from the moment, at which the light emitting devices 8 are driven (incidentally, the signal level of the corresponding timing signal becomes "H"), as illustrated in the time chart of FIG. 12, in such a way that these moments are not matched with each other.

Further, although the light emitting diode emits heat when this diode is energized, there is a tendency of the quantity of emitted light to decrease when this diode is energized and emits light. It is, therefore, necessary for stabilizing the quantity of light to restrain the light emitting diode from emitting heat. Accordingly, in the case that when the light emitting diode is energized and emits heat, the radiation of heat from the supporting base 11 is insufficient and thus, the quantity of light emitted from the light emitting diode decreases, the light emitting diode may be driven intermittently, instead of being driven continuously. Namely, the energization and the light emitting operation of the light emitting diode may be restrained by establishing idle periods in which the operation of emitting light is ceased.

Incidentally, heat emitted from the light emitting devices 8 is conducted or transmitted through a path from the light emitting board 9, the pressure sensitive adhesive double coated tape 56 and the supporting base 11. Finally, heat is radiated from the supporting base 11 made of metal such as aluminum. At that time, if the thickness of the pressure sensitive adhesive double coated tape 56 is not less than 200 the heat conductivity from the light emitting board 9 is extremely deteriorated. In contrast, if the thickness of the pressure sensitive adhesive double coated tape 56 is less than 200 the heat conductivity is better. However, when the pressure sensitive adhesive double coated tape 56 receives heat for a long term, the adhesive surfaces thereof come to exhibit higher adhesiveness (or strength). In the case where the pressure sensitive adhesive double coated tape 56 contains no base, namely, the thickness of the tape 56 is not more than 50 the tape 56 becomes merely an adhesive agent. Namely, the tape 56 loses advantages in serving as a cushion. Therefore, when using this tape actually, the thickness of the tape 56 should be within the range from 50 to 200.

Figure 13:
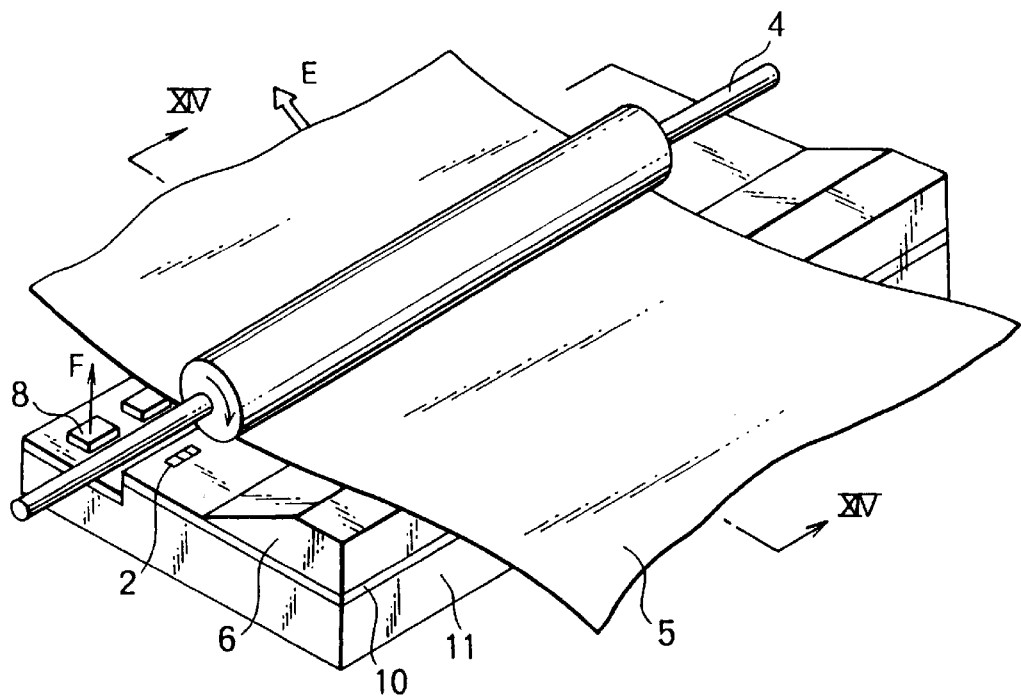
FIG. 13 is a perspective diagram for illustrating a method of conveying or feeding recording paper in the recording apparatus of the present invention.
Figure 14:
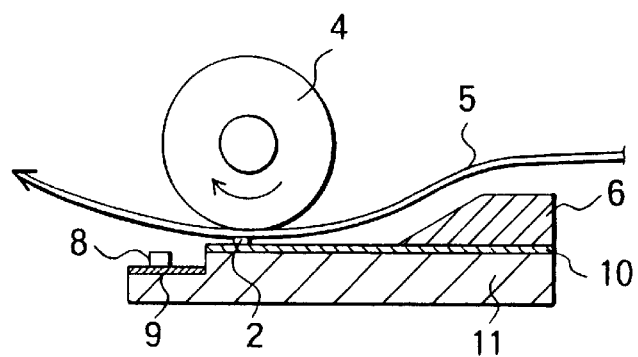
FIG. 14 is a sectional view of the recording apparatus taken in the direction of arrows along line XIV—XIV of FIG. 13.

FIG. 13 is a perspective diagram for illustrating a method of conveying or feeding recording paper in the recording apparatus of the present invention. FIG. 14 is a sectional view of the recording apparatus taken in the direction of arrows along line XIV—XIV of FIG. 13. As shown in FIG. 13, the platen roller 4 for conveying the recording paper 5 is supported by a cover (not shown) and is placed in such a manner as to face the heating elements 2. The platen roller 4 constitutes a paper feeding mechanism for conveying the recording paper 5 in the direction of an arrow E of FIG. 13. During the recording paper 5 is conveyed by the platen roller 4, the coloring (namely, the color development) of the paper is performed on the arrangement line of the heating elements 2 by selectively driving arbitrary ones of the heating elements 2. Then, the fixing of an image is performed by using light emitted from the light emitting elements 8. Thereby, the recording of the image is achieved.

In the case of the recording apparatus of this embodiment, light for fixing is emitted in the direction of an arrow F in this figure. Further, in this apparatus, fixing light is applied from the light emitting devices 8 onto the recording paper, which has been colored when passing over the arrangement lines of the heating elements 2. Thereby, the conveyance of the recording paper can be performed by maintaining the planar state of the recording paper. As a result, the recording paper can be conveyed without paper jam. Moreover, with such a configuration, the integration of the electronic components can be achieved. Consequently, the size of the recording apparatus can be reduced. Moreover, the replacement of a component in the recording apparatus can be facilitated.

Further, in the case of the recording apparatus of this embodiment, light emitting diodes are used as the light emitting devices 8. Thus, the width of the light source may be equal to the width of the recording paper. Consequently, the reduction in size of the recording apparatus can be achieved. Moreover, the spacing between the light emitting device 8 and the recording paper can be decreased. Thereby, the miniaturization of the recording apparatus can be achieved. Furthermore, the quantity of light for fixing can be small. Additionally, the deterioration life of the light emitting device 8 can be increased. Consequently, the reliability of the recording apparatus can be enhanced.

In addition, in the case of the recording apparatus of this embodiment, the driving power supply potential of the heating elements 2 is set as being equal to that of the light emitting devices 8. Thus, the number of electrical connections of electronic components can be reduced. Moreover, a high-voltage power supply can be shared. Consequently, the efficiency in using the power supply of the recording apparatus can be increased.

EMBODIMENT 2

Figure 15:
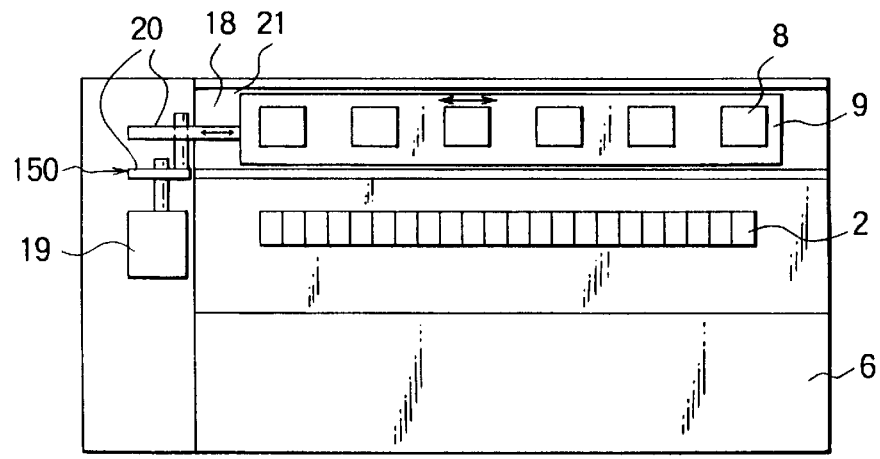
FIG. 15 is a plan view of a primary part of another example of the recording apparatus of the present invention.
Figure 16:
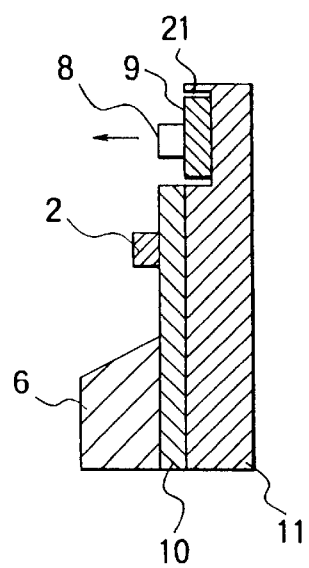
FIG. 16 is a side view of the primary part of FIG. 15.
Figure 17:
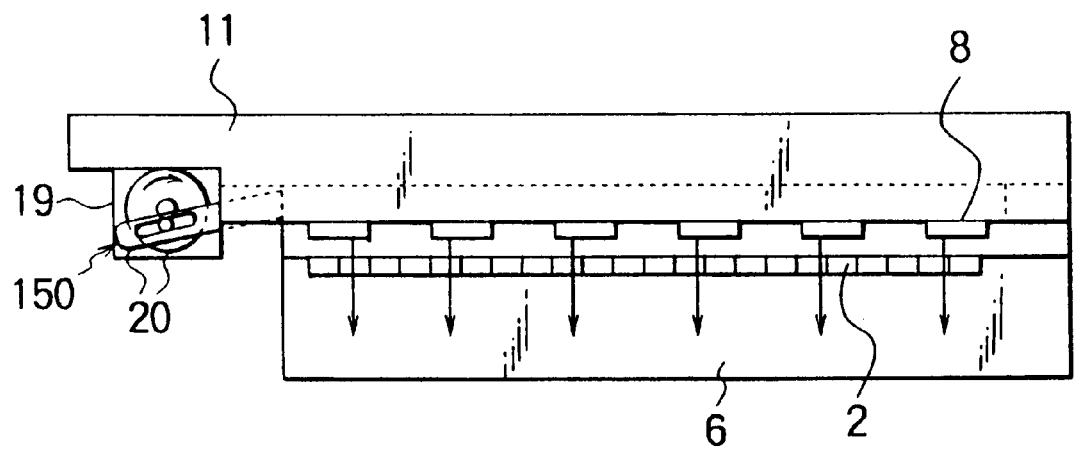
FIG. 17 is a top view of the primary part of FIG. 15.

FIG. 15 is a plan view of a primary part of another example of the recording apparatus of the present invention. Further, FIG. 16 is a side view of the primary part of FIG. 15. Moreover, FIG. 17 is a top view of the primary part of FIG. 15. As shown in FIG. 15, the light emitting devices or elements 8 are disposed on the heating element board 9 in such a manner as to be in parallel with the arrangement line of the heating elements 2. Furthermore, similarly as in the case of Embodiment 1, a heating element board 10, on which the heating elements 2 and the circuit component configuration portion 6 are loaded, are placed on the supporting base 1. Further, a groove 18 serving as a guide member is formed in the supporting base 11 in a direction perpendicular to a direction in which the recording paper (not shown) is conveyed. Moreover, the light emitting board 9 is movably accommodated in the groove 18. Furthermore, a motor 19 is placed on the supporting base 11. Additionally, a cam mechanism 20 for converting a rotational motion of the motor 19 into a linear motion is connected to the motor 19 and is further connected to an edge portion of the light emitting board 9. Moreover, grease 21 is applied to a space between the light emitting board 9 and the groove 18, so that the movement of the light emitting board 9 is facilitated. The motor 19 and the cam mechanism 20 compose a movement mechanism 150 for causing a reciprocating motion of the light emitting board 9. The rest of the configuration of this embodiment is similar to the corresponding components of Embodiment 1.

In the case of the recording apparatus of Embodiment 2, the rotational motion of the motor 19 causes the light emitting board 9, on which the light emitting devices 8 are mounted, to perform reciprocating motion in a direction perpendicular to the direction in which the recording paper is conveyed. Further, when conveying or feeding the recording paper, this reciprocating motion is performed by employing a travel (or a movement distance) which is not less than the arrangement pitch of the light emitting devices 8. Thereby, the variation in quantity of light due to the clearance between the light emitting devices can be eliminated. Furthermore, the light emitting devices 8 can be arranged in a line instead of disposing the light emitting devices 8 in the staggered arrangement. Thus, the fabrication of the light emitting board can be facilitated. Moreover, the arrangement pitch or interval can be increased. Thereby, the number of the light emitting devices 8 can be reduced. Consequently, the cost of the recording apparatus can be decreased.

EMBODIMENT 3

Figure 18:
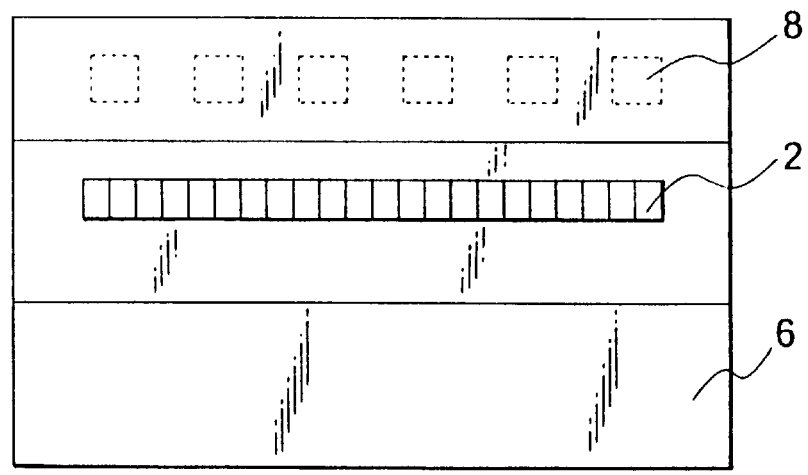
FIG. 18 is a plan view of a primary part of still another example of the recording apparatus of the present invention.
Figure 19:
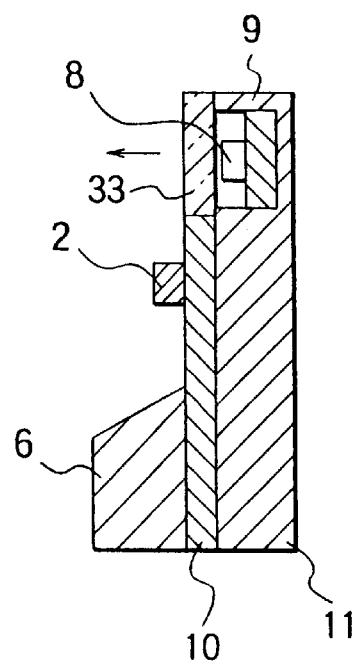
FIG. 19 is a sectional view of the primary part of FIG. 18.

FIG. 18 is a plan view of a primary part of still another example of the recording apparatus of the present invention. FIG. 19 is a sectional view of the primary part of FIG. 18. In the primary part of FIG. 18, a transparent plate 33 constituted by a glass plate having a thickness of, for example, 0.7 mm or so is placed on the light emitting device 8. The transparent plate 33 is fixed to the supporting base 11 by using an adhesive agent (not shown) or a pressure sensitive adhesive double coated tape (not shown). The rest of the configuration of Embodiment 3 is similar to the corresponding part of Embodiment 1.

In the case of the light emitting board 9 on which the plurality of light emitting devices 8 are placed, the thickness of the light emitting diode causes a difference in level among portions of the board 9. Thus, there is the possibility of an occurrence of paper jam in a step-like portion in the board 9. In the case of Embodiment 3, the transparent plate 33 is placed on the light emitting device so as to eliminate this difference in level, namely, such a step-like portion and to facilitate the conveyance of recording paper.

Incidentally, if the light emitting device 8 comes close to the recording paper as much as possible, the loss of the quantity of light can be prevented. Ideally, the glass plate is placed on the light emitting device 8 in such a way as to directly touch the device 8. In such a case, the loss in quantity of light, which is caused until the light reaches the recording paper, is only the transmission loss of light in the glass plate. However, in the case of the light emitting device 8 using a light emitting diode, there occurs a variation in thickness of solder when soldering the light emitting diode so as to load this diode on the light emitting board 9. This results in variation in height at which the light emitting diode is fixed. Moreover, when fabricating light emitting diodes, there is a variation in thickness among the light emitting diodes. Thus, it is actually difficult to place the glass plate in such a way as to directly touch the light emitting device. Consequently, the transparent plate 33 is placed in such a manner that a predetermined clearance is provided between the light emitting device 8 and the transparent plate 33.

Meanwhile, if the thickness of the glass plate used as the transparent plate 33 is decreased, the glass plate becomes fragile. In contrast, if the thickness of the glass plate is increased in order to prevent the glass plate from easily being broken, the loss of the quantity of light occurring between the light emitting device 8 and the recording paper increase. Thus, in the case of this embodiment, the platen roller for conveying the recording paper is positioned in the neighborhood of the top surface of the supporting base which supports the transparent plate 33. Further, the platen roller is inhibited from being placed at a position of a part, which is not supported, of the central portion of the transparent plate 33. Thereby, shearing force is prevented from acting on the transparent plate 33. In addition, the thickness of the glass plate is set at 0.7 mm or so.

Incidentally, if the thickness of this glass plate is set at a value which is not more than 0.6 millimeters (mm), the glass plate is easily broken when packing, transporting the glass plate or opening the package of the glass plate. Thus, careful handling is required to prevent the glass plate from being broken. Further, if the thickness of the glass plate is not less than 0.6 mm, careful handling is also required when fabricating electronic components. It is, therefore, impractical that the thickness of the glass plate is not more than 0.6 mm.

In passing, the glass plate is fixed by the pressure sensitive adhesive double coated tape stuck onto the supporting base. The reason will be described hereinbelow. Namely, the supporting base 11 is different in coefficient of linear expansion from the glass plate. However, for preventing the glass plate from being broken owing to the difference in coefficient of linear expansion when the temperature of the apparatus is raised during an operation of the heating elements 2 and the light emitting devices 8 or when the ambient temperature changes, it is necessary that the pressure sensitive adhesive double coated tape is used not only as a securing means but also as a cushion (or a shock absorbing material).

In the case of this embodiment, when a blue light emitting diode is used as the light emitting device 8, a green solder resist is usually used as the solder resist of the light emitting board, from the viewpoints of the price thereof. Further, light emitted from the blue light emitting diode is partly reflected by the transparent plate 33 to the diode. The reflected light is further reflected by the solder resist on the surface of the light emitting board on which the light emitting diode is loaded.

Moreover, when using the transparent plate 33 similarly as in the case of this embodiment, if the light emitting diode is a blue light emitting diode and the color of the solder resist is blue or white, a fixing time required to fix an image on the recording paper is shorter than the case that the color of the solder resist is black, green, red or yellow. Furthermore, if the color of the solder resist is white, the fixing time is shorter than the case in which the color thereof is blue.

Incidentally, in view of ineffective irradiation of emitted light due to the reflection by the light emitting devices 8, a combination of reflection plates (not shown) may be employed so that the fixing time is further reduced. Further, in the case of this embodiment, the glass plate is sued as the transparent plate 33. Another plate having filter characteristics, by which only light of a specific wavelength can be transmitted, or a transparent plastic material may be used as the transparent plate 33.

In the case of this embodiment, the transparent plate 33 is placed on the light emitting device 8. Thus, the conveyance or feeding of the recording paper can be facilitated by conveying the recording paper onto the transparent plate 33. Moreover, if this embodiment is combined with the mechanism of Embodiment 2, the light emitting devices 8 can be made to perform reciprocating motions under the transparent plate 33. Even in such a case, the recording paper can be smoothly conveyed without being obstructed by the light emitting devices 8.

EMBODIMENT 4

Figure 20:
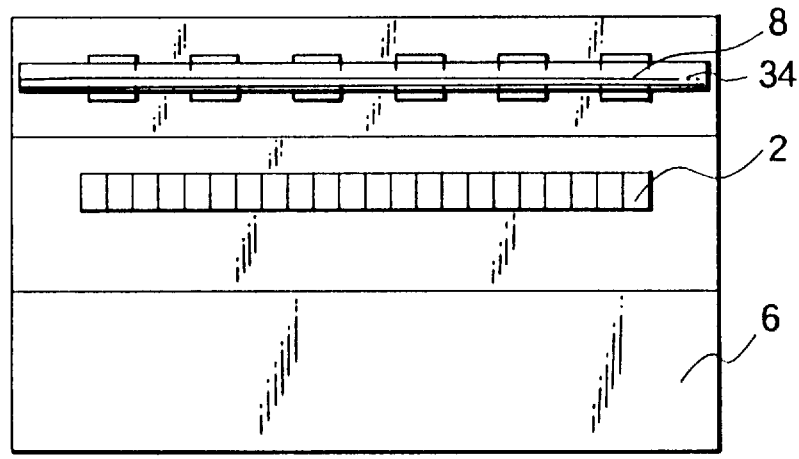
FIG. 20 is a plan view of a primary part of yet another example of the recording apparatus of the present invention.
Figure 21:
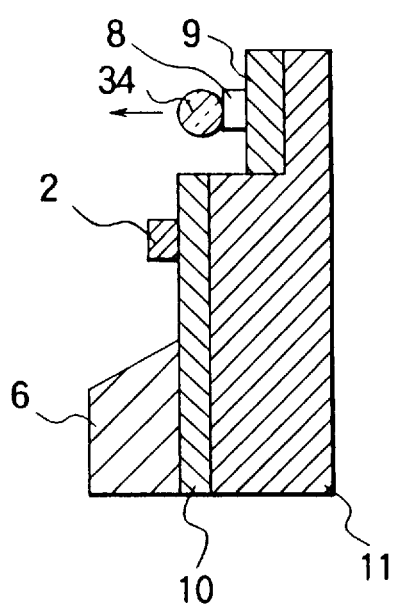
FIG. 21 is a sectional view of the primary part of FIG. 20.

FIG. 20 is a plan view of a primary part of yet another example of the recording apparatus of the present invention. FIG. 21 is a sectional view of the primary part of FIG. 20. In the case of this embodiment, a condensing member is placed on the light emitting device 8 serving as the light emitting means. As shown in these figures, a condensing member 34 constituted by, for example, a glass pole is placed on the light emitting device 8. The remaining composing elements of this embodiment are similar to the corresponding elements of Embodiment 1.

The light emitting device 8 emits light radially. It is, however, necessary for effectively applying the light, which has been radially radiated, on the surface of the recording paper to condense the light, which has been emitted from the light emitting device 8, in the direction of the recording paper. In the case of this embodiment, the glass pole 34 placed on the light emitting device 8 has a circular section, so that the emitted light is refracted in the glass pole 34 and is then condensed onto a part, which is in contact with the glass pole, of the surface of the recording paper. Incidentally, the condensing member is not limited to the glass pole 34. As long as the distribution of the light emitted from the light emitting device 8 is efficiently condensed on the surface of the recording paper, any other member may be employed as the condensing member. Moreover, the transparent plate 33 of Embodiment 3 may be placed on the condensing member so that the conveyance of the recording paper is facilitated. Furthermore, the surface of the transparent plate may be partly formed like a lens, so that the transparent plate further serves as a condensing member.

In the case of the recording apparatus of Embodiment 4, the condensing member is placed on the light emitting device 8. Thereby, the emitted light can be condensed onto the surface of the recording paper. Consequently, the quantity of light can effectively be utilized.

EMBODIMENT 5

Figure 22:
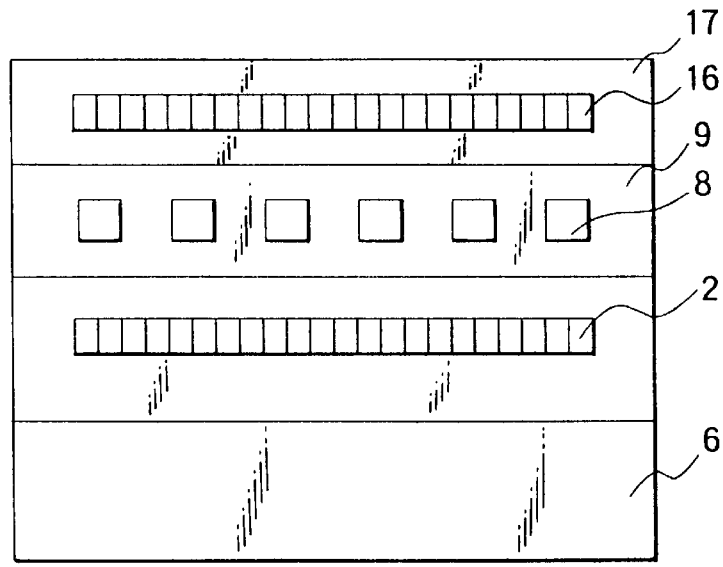
FIG. 22 is a plan view of a primary part of a further example of the recording apparatus of the present invention.

FIG. 22 is a plan view of a primary part of a further example of the recording apparatus of the present invention.

Figure 23:
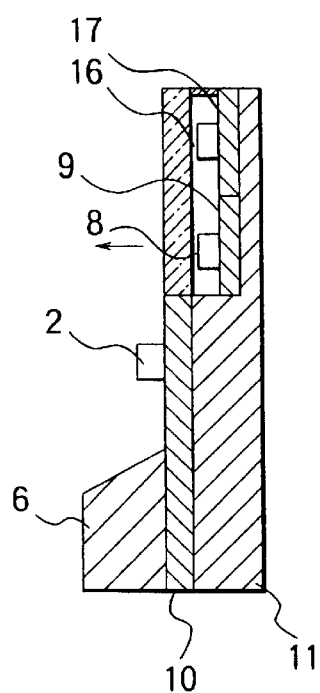
FIG. 23 is a sectional view of the primary part of FIG. 22.

FIG. 23 is a sectional view of the primary part of FIG. 22. As shown in this figure, a light receiving element board 17, on which a plurality of light receiving elements (or devices) 16 are mounted in such a way as to be parallel to the arrangement line of the heating elements 2, is placed on the supporting base 11. The light receiving element is connected to a interpreting or reading device (not shown). The remaining composing elements of this embodiment are similar to the corresponding composing elements of Embodiment 3.

Figure 24:
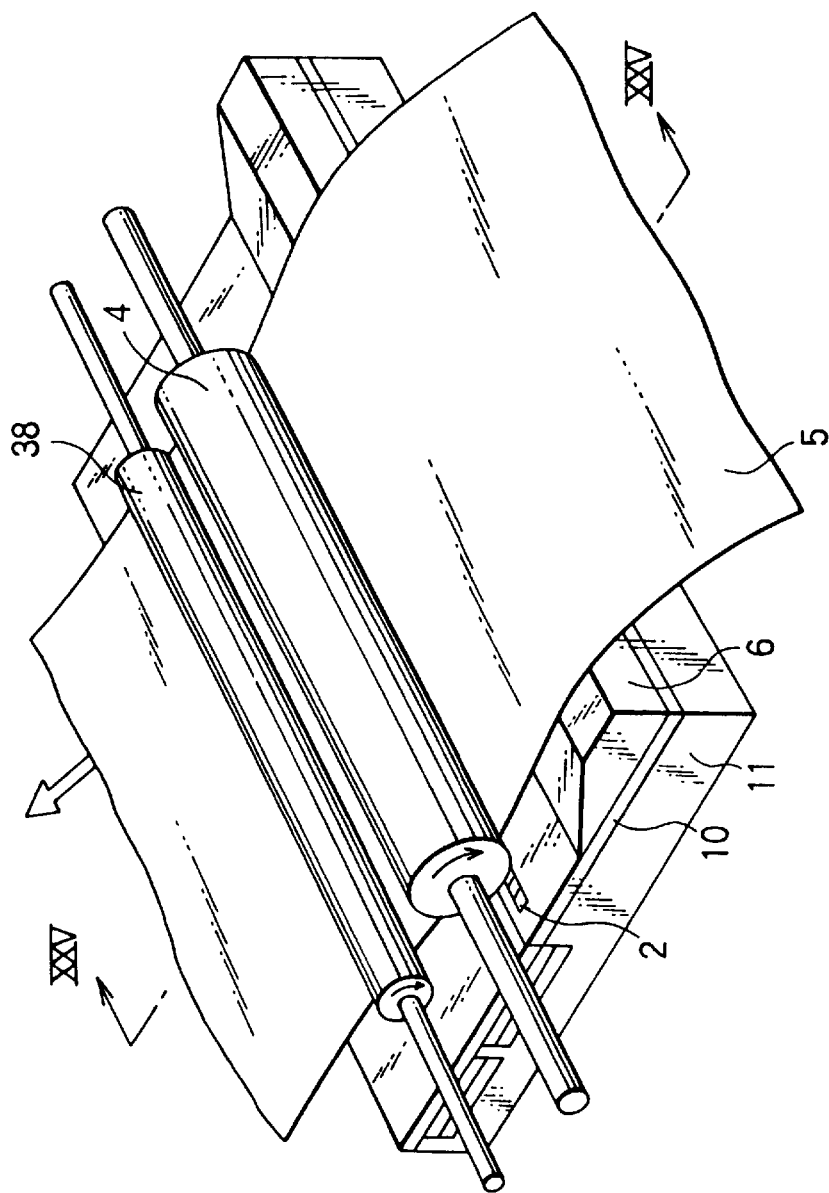
FIG. 24 is a perspective diagram for illustrating a method of conveying or feeding recording paper in the recording apparatus of the present invention.
Figure 25:
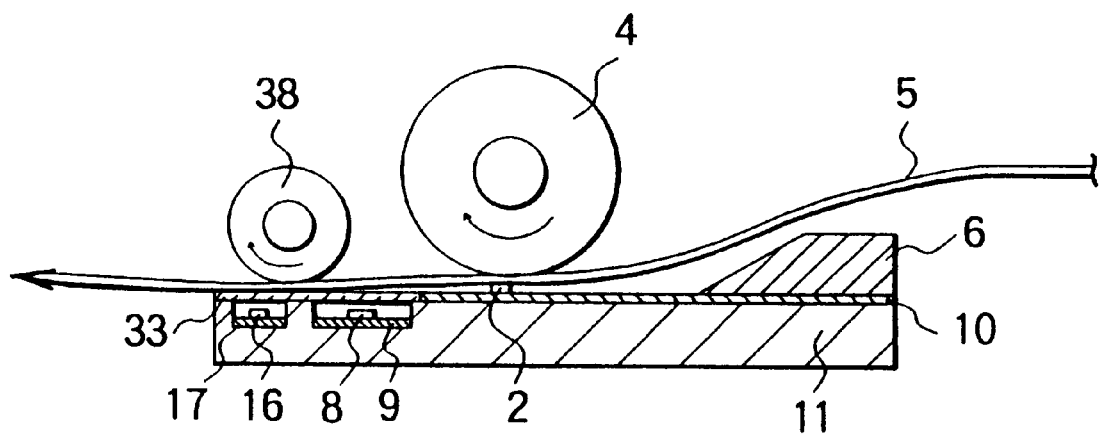
FIG. 25 is a sectional view of the recording apparatus taken in the direction of arrows along line XXV—XXV of FIG. 24.

FIG. 24 is a perspective diagram for illustrating a method of conveying or feeding or conveying recording paper in the recording apparatus of the present invention. FIG. 25 is a sectional view of the recording apparatus taken in the direction of arrows along line XXV—XXV of FIG. 24. As shown in these figures, the platen roller 4 for conveying the recording paper 5 is placed on the arrangement line of the heating elements 2 in such a way as to be supported by a cover (not shown) and face the heating elements 2. Further, a light-receiving-element platen roller 38 is placed on the vicinity of the arrangement line of the light receiving elements 16.

In the case of this embodiment, operations of recording and fixing of an image on the recording paper 5 are similar to those of Embodiment 1. Thus, the description of those operations are omitted for simplicity of description. The recording paper 5, on which the recording and fixing of an image have been performed, passes over the arrangement line of the light receiving elements 16. Further, when the recording paper 5 passes above the light receiving elements 16, a result of recording the image (namely, a record) is read by the light receiving elements 16. Then, the record is read by an interpreting or reading device (not shown). Namely, after the fixing of a record on the recording paper, the reading of the result of recording can be achieved during feeding the recording paper. Thus, the reliability of the recording by using the recording apparatus can be enhanced. Furthermore, the light receiving element 16 may be used as a detection device for detecting whether or not the recording paper 5 is present. Moreover, a failure in recording, which is caused by the failure of the heating element 2 or the light emitting device 8, can be thus checked.

Further, when the cover (not shown) is opened, it is detected by the light receiving elements 16 that the quantity of light is increased. Thereby, a state of the apparatus, in which the cover is opened, can be detected.

In the case of this embodiment, the recording paper 5 passes over the arranged light receiving elements 16. A result of recording is read by the light receiving elements 16, so that the reliability of the recording apparatus can be enhanced.

Additionally, the light receiving elements 16 can detect the presence of the recording paper 5 and the opened/closed state of the cover. Thus, the prior art optical detection sensor 126 for detecting the recording paper 5, and the prior art optical detection sensor 127 for detecting the opened and closed states of the cover 121 can be omitted. Consequently, the number of components provided in the recording apparatus can be reduced. Moreover, the cost of the recording apparatus can be decreased.

EMBODIMENT 6

Figure 26:
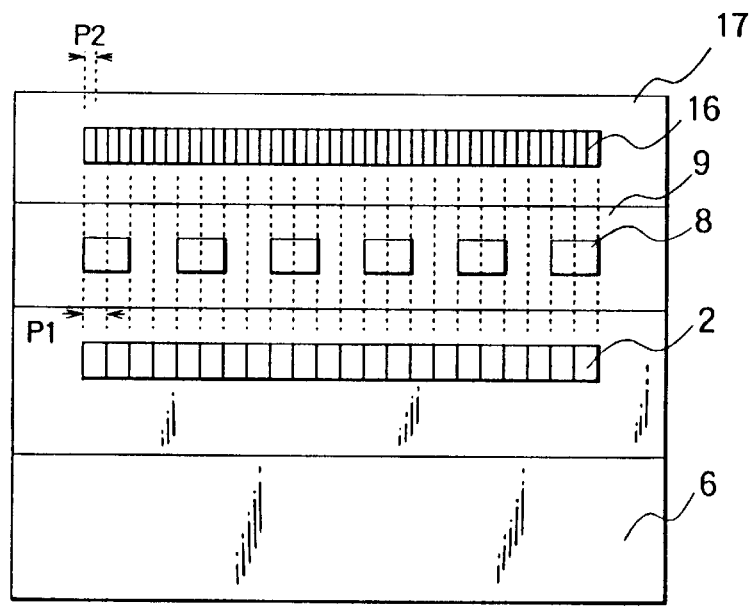
FIG. 26 is a plan view of a primary part of a further example of the recording apparatus of the present invention.
Figure 27:
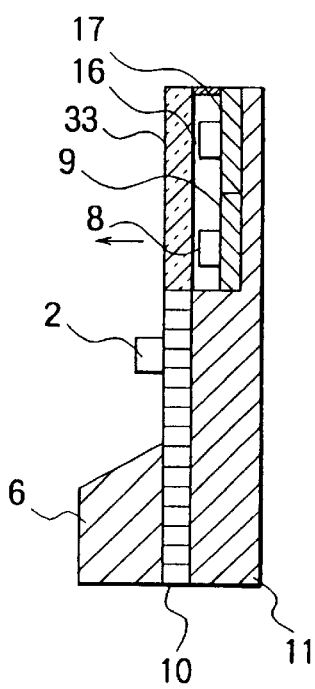
FIG. 27 is a sectional view of the primary part of FIG. 26.

FIG. 26 is a plan view of a primary part of a further example of the recording apparatus of the present invention. FIG. 27 is a sectional view of the primary part of FIG. 26. As illustrated in these figures, a plurality of heating elements 2 are arranged in a line at an arrangement pitch P1. Further, a plurality of light receiving elements 16 are arranged in a line at an arrangement pitch P2, which is not more than the pitch P1, in such a manner as to be parallel with the arrangement line of the heating elements 2. The remaining composing elements of this embodiment are similar to the corresponding composing elements of Embodiment 5.

Because the arrangement pitch P2 of the light receiving elements 16 is set as being equal to or less than the arrangement pitch P1 of the heating elements 2, a light receiving element board 7 can easily be placed and fabricated on the supporting base 11 by disregarding the arrangement pitch of the heating elements 2 of the heating element board 10 when fabricating the recording apparatus.

In the case of the recording apparatus of Embodiment 6, the arrangement pitch of the light receiving elements 16 is set as being equal to or less than the arrangement pitch of the plurality of the arranged heating elements 2. Thus, the fabrication of the apparatus can be facilitated only by carefully handling the arrangement lines of the light receiving elements 16 and the heating elements 2 in such a way that these lines of the elements 16 and 2 are parallel with each other.

EMBODIMENT 7

Figure 28:
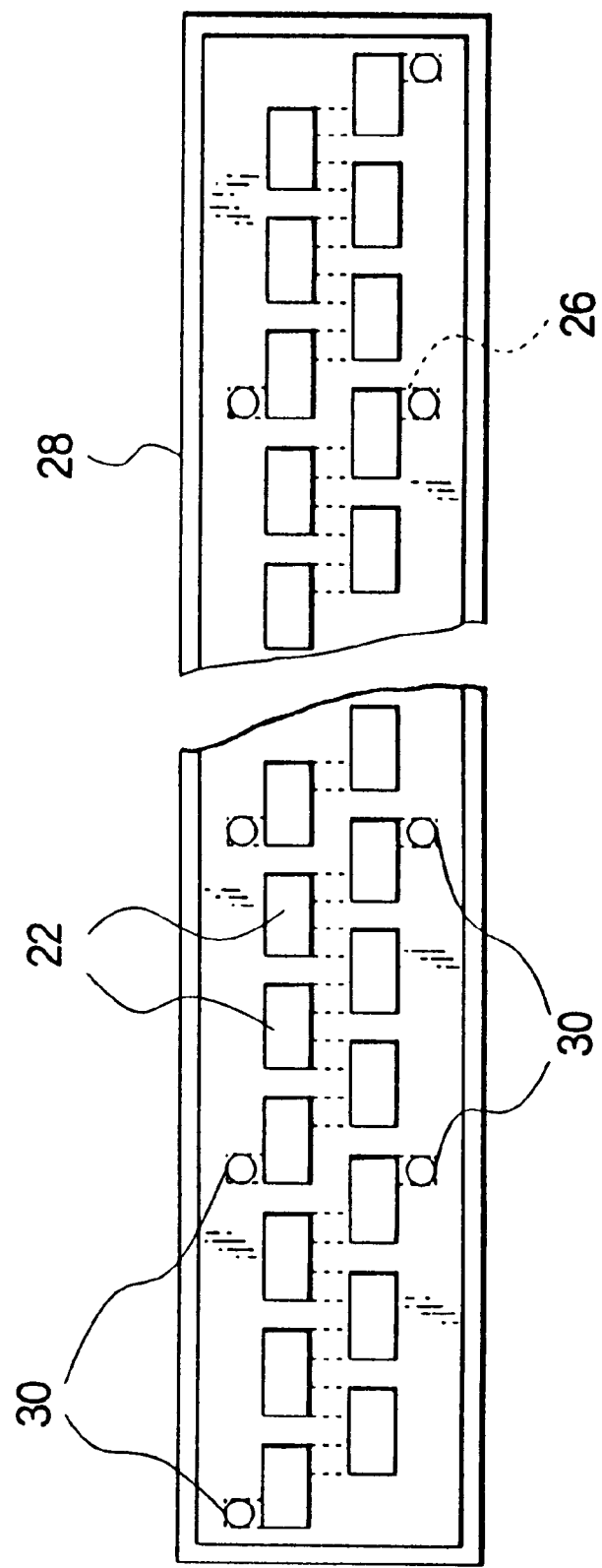
FIG. 28 is a plan view of a light emitting board of another example of the recording apparatus of the present invention.
Figure 29:
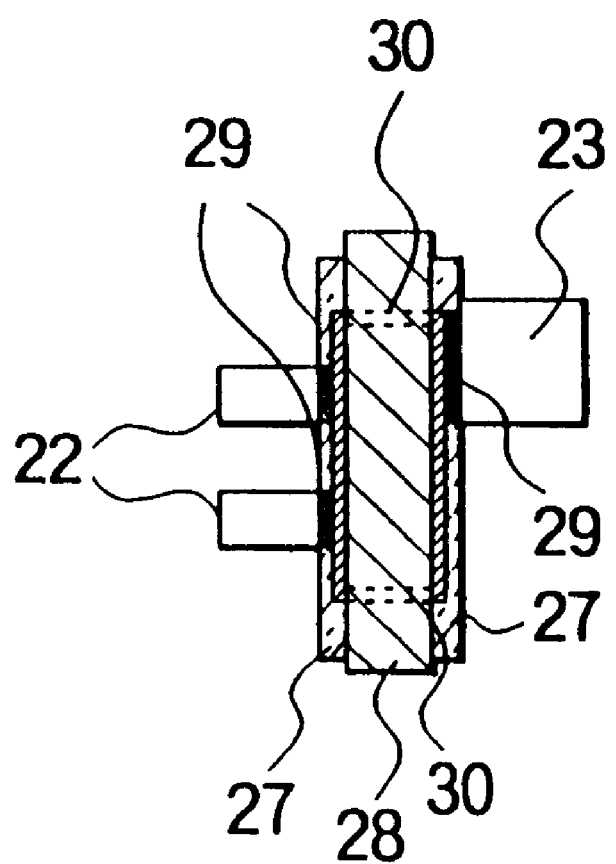
FIG. 29 is a sectional view of the light emitting board of FIG. 28.

FIG. 28 is a plan view of a light emitting board of another example of the recording apparatus of the present invention. FIG. 29 is a sectional view of the light emitting board of FIG. 28. As shown in these figures, light emitting elements 22 acting as the light emitting means are mounted in the staggered arrangement on the light emitting board 28 made of, for instance, a glass epoxy material. Practically, the light emitting devices 22 are solderable light emitting diodes.

Moreover, solderable chip resistors 23 to be connected in series with the light emitting devices 22 are placed on the light emitting board 28. The chip resistors 23 are resistors for limiting the energizing current for the light emitting devices 22. The light emitting devices 22, the chips 23 and through holes 30 are electrically connected through the conductive pattern 26. Further, the conductive pattern 26 is covered with an insulating solder resist 27. The light emitting devices 22 and the chip resistors 23 are soldered to the conductive pattern 26 by using solder 29. The equivalent circuit of a light emitting board 28 is the same as illustrated in FIG. 8, namely, as employed in Embodiment 1. The remaining composing elements of Embodiment 7 are similar to the corresponding composing elements of Embodiment 1.

The light emitting board 28 is different from the light emitting board 9 of FIG. 6, which has been described in the foregoing description of Embodiment 1, in that the former board 28 is a double-sided pattern board having through holes 30, and in that the chip resistors 23 are placed on the rear or back surface of the print board 28. If the thickness of the chip resistor 23 is large, the chip resistors 23 become higher than the light emitting devices 8, so that the light emitting devices 22 cannot come close to the recording paper. However, in the case of Embodiment 7, the distance from the recording paper is not determined by the thickness of the chip resistors 23, because the chip resistors 23 are placed on the back surface of the print board 28. Further, heat emitted from the chip resistors 23 can be radiated from

EMBODIMENT 8

Figure 30:
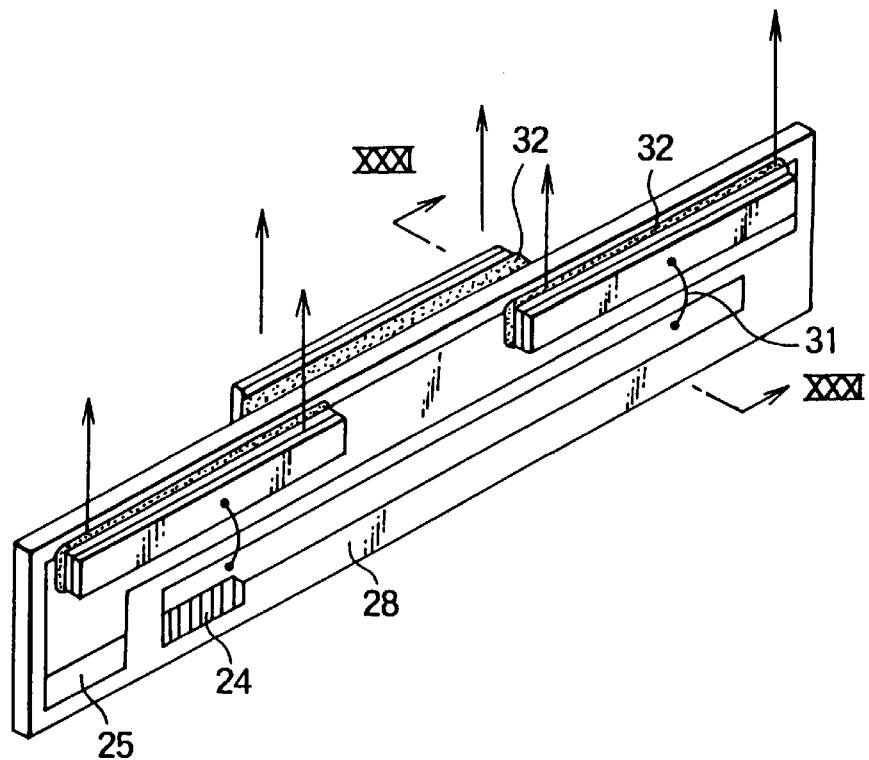
FIG. 30 is a perspective diagram for illustrating a light emitting board of another example of the recording apparatus of the present invention.
Figure 31:
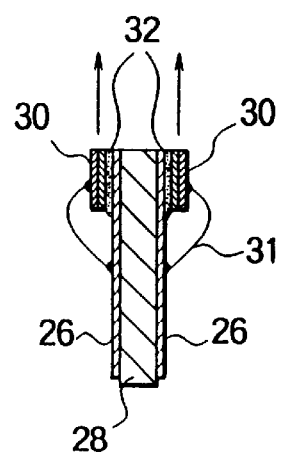
FIG. 31 is a sectional view of the recording apparatus taken in the direction of arrows along line XXXI—XXXI of FIG. 30.

FIG. 30 is a perspective diagram for illustrating a light emitting board of another example of the recording apparatus of the present invention. FIG. 31 is a sectional view of the recording apparatus taken in the direction of arrows along line XXXI—XXXI of FIG. 30. As shown in these figures, on light emitting devices 30 are placed at predetermined intervals on both sides or surfaces of an end portion of the light emitting board 28. Further, the light emitting devices 30 placed on both sides of this board in such a manner that these devices are mounted in the staggered arrangement in the direction along which a section of the board extends. The light emitting devices 30 are actually light emitting diode chips. The light emitting devices 30 are electrically connected with the conductive pattern 26 provided on the light emitting board 28 through gold wires 31. The light emitting devices 30 are fixed onto the light emitting board 28 by a conductive adhesive agent 32. Further, the conductive pattern 26 has a positive electrode terminal 24, which is connected to the light-emitting-diode driving power supply, and a GND electrode terminal 25 of the light emitting diode. Furthermore, the remaining composing elements of Embodiment 8 are similar to the corresponding composing elements of Embodiment 1.

An electric current drawn from the light emitting device 30 flows though a path consisting of the positive electrode terminal 24, the back surface of the chip 30, the front surface thereof, the gold wire 31 and the GND electrode 25. Further, light emitted from the light emitting device 30 is radiated from a P-N junction face on the side of the light emitting device 30 as indicated by an arrow in FIG. 31. Thus, the quantity of light required for fixing can be further efficiently obtained by using the side surface of the chip as a light emitting face, similarly as in the case of this embodiment.

In the case of this embodiment, the (longitudinal) dimension or measurement of the light emitting board 28, which is measured in the direction of recording paper, is small. Thus, the distance from the heating element 2 for coloring to the fixing light source can be reduced. Consequently, the size of the recording apparatus can be further decreased. Incidentally, the light emitting devices 30 and the gold wires 31 provided on the light emitting board 28 are covered with a protective resin (not shown), for instance, a transparent silicone resin.

EMBODIMENT 9

Figure 32:
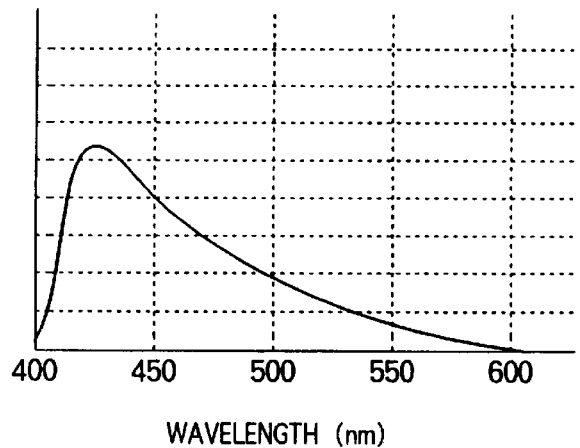
FIG. 32 is a graph for illustrating the emitted-light wavelength characteristics of a blue light emitting diode, which uses a SiC substrate, of another example of the recording apparatus of the present invention.
Figure 33:
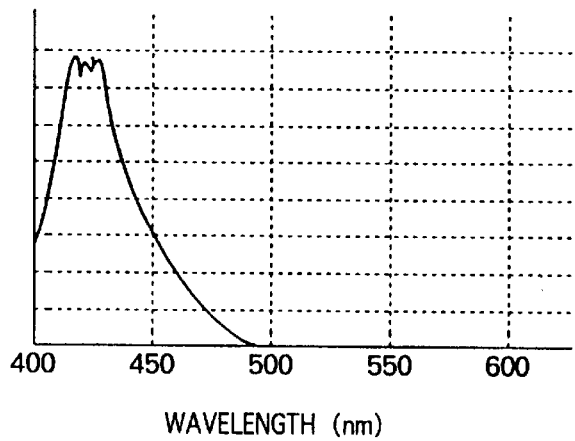
FIG. 33 is a graph for illustrating the light wavelength absorption range characteristics of recording paper.

FIG. 32 is a graph for illustrating the emitted-light wavelength characteristics of a blue light emitting diode, which uses a SiC substrate, of another example of the recording apparatus of the present invention. The time period required for fixing an image on thermosensitive paper of the optical fixing type is independent of the quantity of light but is dependent on the wavelength of light emitted from a light source. FIG. 33 is a graph for illustrating the light wavelength absorption range characteristics of recording paper. This thermosensitive paper of the optical fixing type absorbs light having the characteristics illustrated in this figure, so that an image is fixed thereon. Therefore, the closer the characteristics of a light source become to those of FIG. 33, the more efficiently the fixing can be performed.

According to results of studying spectra of various light sources, as illustrated in FIG. 33, the peak is obtained in the vicinity of the wavelength of 430 nano-meters (nm), in the case of the emitted-light wavelength characteristics of a blue light emitting diode, which uses a SiC substrate. The wavelength corresponding to this peak of the light wavelength absorption range characteristics of recording paper is near to 420 nm. Therefore, this light source is effective as the light source for this thermosensitive paper of the optical fixing type.

Figure 34:
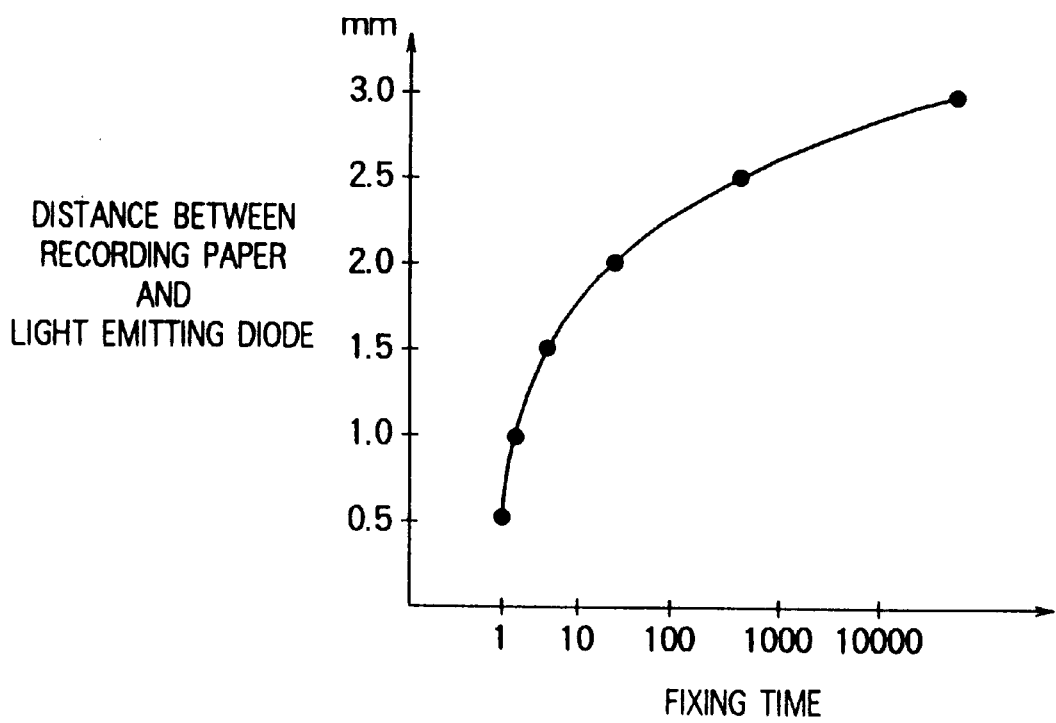
FIG. 34 is a graph for illustrating the relation between a fixing time of recording paper and the distance between the recording paper and the light emitting diode.

Further, results of experiments reveal that the fixing time required for fixing an image on the thermosensitive paper of the optical fixing type by using light emitted from the light emitting diode largely varies with the distance between the light emitting diode and the recording paper. FIG. 34 illustrates the relation therebetween. The experiments are conducted by first securing the recording paper, then moving the light emitting diode for irradiating the recording paper and finally measuring the fixing time required for (optically) fixing a region, which is 2 mm square and is irradiated with light emitted from the light emitting diode.

Incidentally, the fixing time is determined as a period of time from the starting the irradiation to a moment at which the optical density of an unprinted part of the recording paper of FIG. 5 is changed into 0.2 from the initial value (0.6 or so) thereof. (Additionally, the optical density of 0.2 is that of a white part of the recording paper.) As is seen from FIG. 35, if the distance between the light emitting diode and the recording paper is not less than 2 mm, a time period of 10 seconds or more is necessary for fixing the region on the recording paper. Thus, the fixing time is rather long. The cause is assumed that when light emitting diode chips (obtained by cutting IC wafers) are fabricated as the light emitting diodes (namely, solderable electrode chips), the fixing time is affected by the optical directivity due to a case for the light emitting diode.

Figure 35:
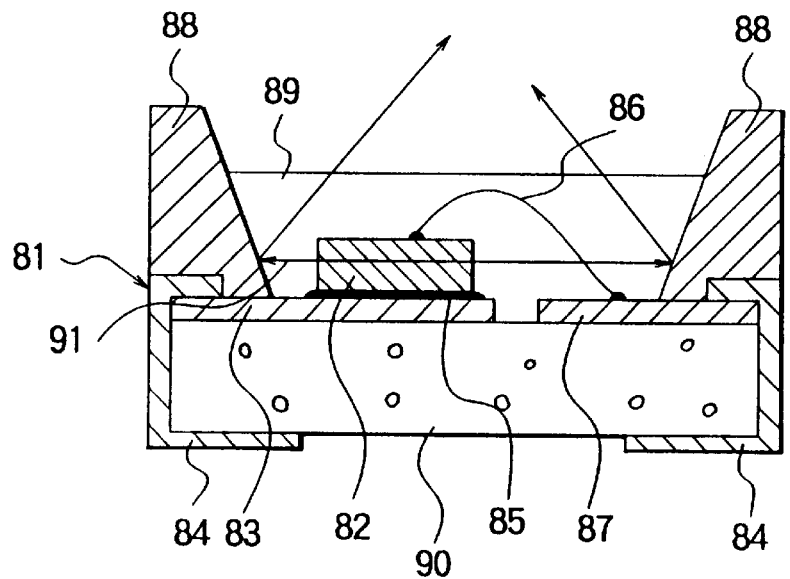
FIG. 35 is a sectional view of a light emitting diode.

FIG. 35 illustrates a sectional view of a light emitting diode 81 used in this embodiment. As shown in this figure, a light emitting diode chip 82, which has been processed and produced by performing an IC fabrication process, is placed on a conductive pattern 83 that is formed on a substrate 90 made of, for example, alumina ceramics. The light emitting diode chip 82 having minute dimensions is cut out of a SiC substrate by a dicing apparatus or the like.

Further, the conductive pattern 83 is provided with a solderable electrode 84. The light emitting diode chip 82 has a back surface connected and fixed to the electrode pattern 83 by using a conductive adhesive agent 85. The top surface of the light emitting diode chip 82 is connected to the electrode pattern 87 through a gold wire 86. A case 88 is provided in an upper portion of the light emitting diode 81. The light emitting diode chip 82 and the gold wire 86 are protected from the open air by a protective resin 89 constituted by, for instance, a silicone resin.

The inner (or inside) surface of the case 88 is inclined so as to direct light, which is emitted from the chip side surface of the light emitting diode chip 82, upwardly. This is because light is emitted from a p-n junction face 91 in the case of the light emitting diode chip 82. Thus, the light is reflected by the inclined inner surface of the case 88 and is then upwardly directed.

Figure 36:
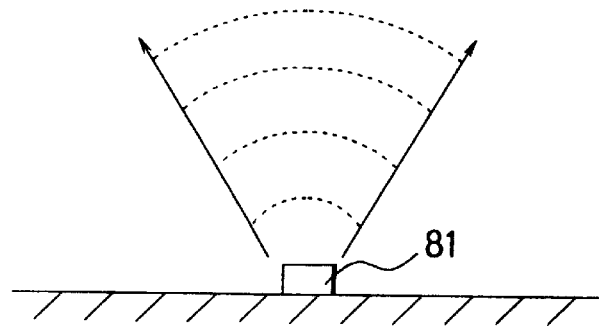
FIG. 36 is a diagram for illustrating directions in which light is irradiated from the light emitting diode.

Such optical directivity is as illustrated in FIG. 36. The upward irradiation direction, in which light is irradiated from the light emitting diode 81, is not only an upwardly vertical direction from the top surface of the chip. Namely, the light emitted from the diode is radiated radially. This is assumed as the cause of a phenomenon that the fixing time is abruptly increased if the distance of the recording paper from the light emitting diode 81 becomes equal to or longer than 2 mm. Thus, if the distance between the light emitting diode 81 and the recording paper is reduced as much as possible, the fixing time is reduced. Practically, the distance therebetween should be equal to or less than 2 mm.

Incidentally, a green solder resist is usually used as the solder resist of the light emitting board, on which the light emitting diodes are mounted, from the viewpoints of the price thereof. However, light emitted from the light emitting diode is reflected on the surface of the light emitting board.

As far as the inventor of the present invention studies, in the case of using this blue light emitting diode, when the color of the solder resist is white, the fixing time is shorter than the case in which the color thereof is green.

Even in the case that a gallium arsenide substrate is used as the blue light emitting diode, the fixing can be performed on the recording paper. However, gallium arsenide requires careful handling when fabricating the diode. Moreover, gallium arsenide is hard to obtain. Furthermore, the price of the blue light emitting diode using a SiC substrate is lower than those of other kinds of blue light emitting diodes.

In the case of the recording apparatus of this embodiment, the light emitting diode using a SiC substrate in the light emitting device is employed. The peak light emitting wavelength is in the vicinity of 430 nm which is close to the absorption wavelength of the thermosensitive paper of the optical fixing type. The fixing of an image on the recording paper can efficiently be achieved by using less energy. Furthermore, such a light emitting diode is easy to obtain. In addition, the price of such a light emitting diode is low.

EMBODIMENT 10

Figure 37:
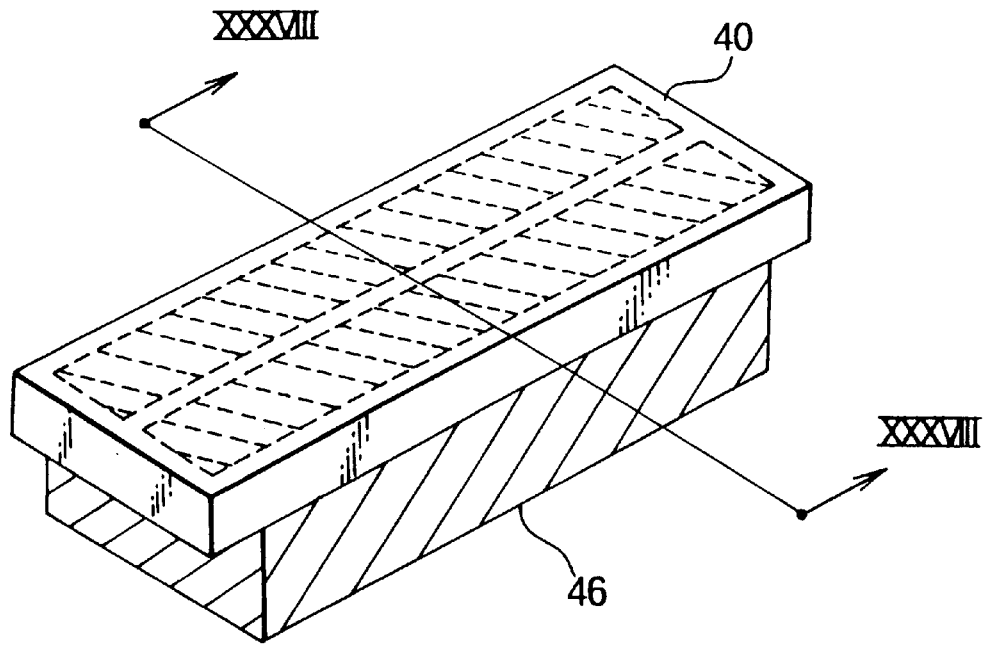
FIG. 37 is a perspective diagram for illustrating light emitting means of another example of the recording apparatus of the present invention.
Figure 38:
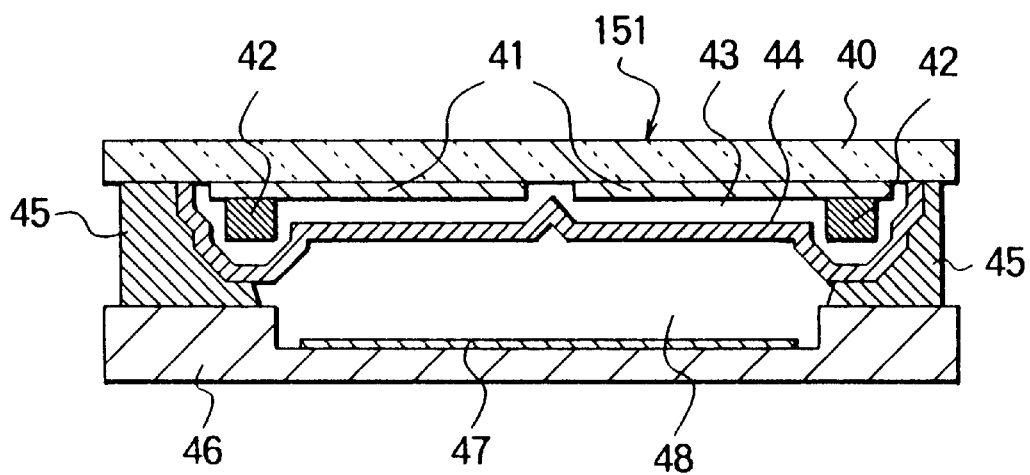
FIG. 38 is a sectional view of the light emitting means taken in the direction of arrows along line XXXVIII—XXXVIII of FIG. 37.

FIG. 37 is a perspective diagram for illustrating light emitting means of another example of the recording apparatus of the present invention. FIG. 38 is a sectional view of the light emitting means taken in the direction of arrows along line XXXVIII—XXXVIII of FIG. 37. As shown in these figures, a transparent conductive film made of, for example, indium tin is formed on the inner surface of a top glass plate 40. Further, transparent electrodes 41, which are a pair of electrodes formed by utilizing photoengraving and etching techniques, are provided thereon. A silver electrode 42 is stacked on a part of the transparent electrode 41 so as to lower the resistance of the conductive pattern of the transparent electrode 41. Further, the transparent electrode 41 and the silver electrode 42 are covered with a dielectric element 43 by performing a printing or a baking on, for instance, insulating glass paste. The dielectric element 4 is further covered with a MgO film 44 in order to prevent the breakdown of the dielectric element 43 owing to the application of a high voltage thereto. The MgO film 44 is formed by utilizing techniques such as a sputtering or a vacuum evaporation.

The top glass plate 41 is overlapped with a bottom glass plate 46. Then, these plates are connected by using sealing glass elements 45 to thereby compose a sealed container 151. A part of the bottom glass plate 46 is processed by, for example, sandblasting. Thus, the thickness of the part of the bottom glass plate 46 is reduced by 0.3 mm. Further, the bottom glass plate 46 is coated with a fluorescent element 47 and is then baked and fixed. The sealed space between the top glass plate 41 and the bottom glass plate 46 is filled with an inert mixed gas 48 after evacuated from a hole (not shown) bored therein.

In the case of a light source of FIG. 38 used in this embodiment, an alternating current voltage of 200 volts or so is applied across the opposite silver electrodes 42. Electric charges, which have been charged or stored in the MgO film 44 formed on the transparent electrode 42, impinge upon the fluorescent surface 47 in the mixed gas 48. Then, the light is emitted in the direction of the top glass plate 41 at the light emitting wavelength of the fluorescent element 47. Namely, this light source is what is called a plasma light emitting light source. Further, light is transmitted by the transparent electrode 42 and is then emitted in the direction of the top glass plate 41.

Figure 39:
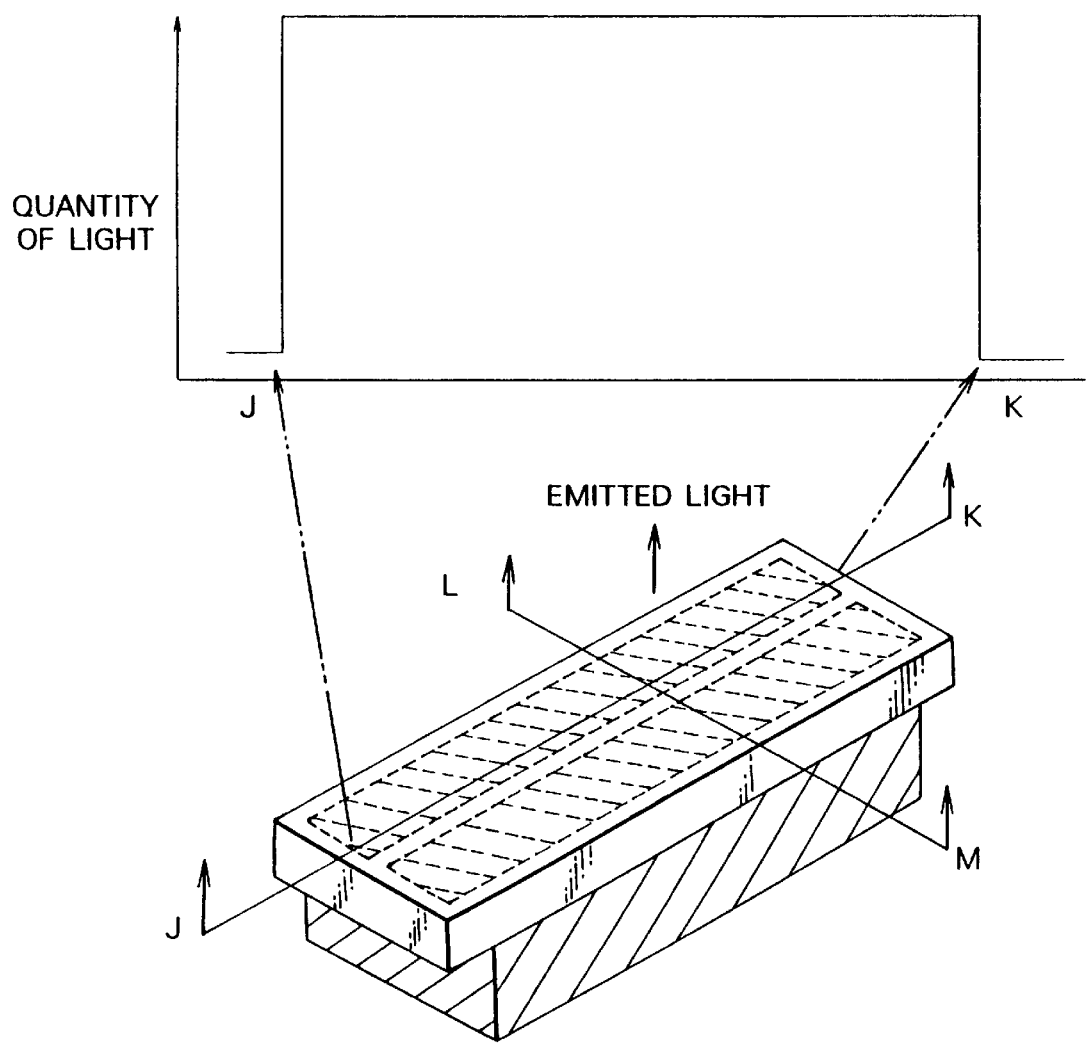
FIG. 39 is a diagram for illustrating the distribution of light emitted from a light source.
Figure 40:
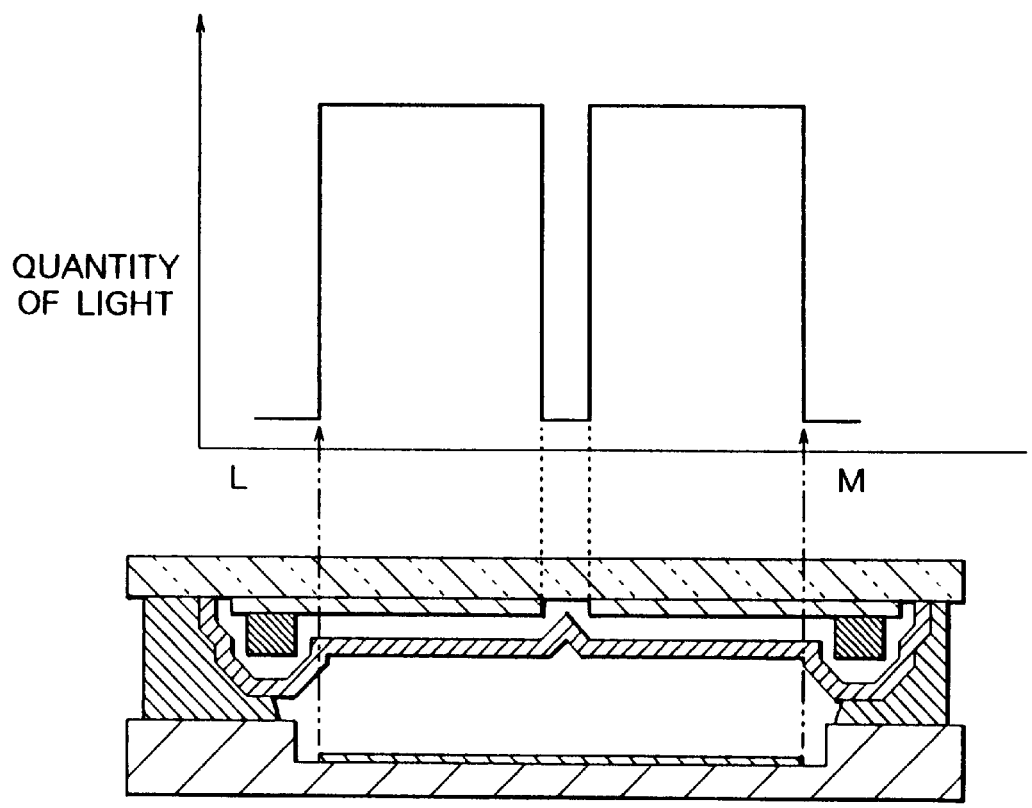
FIG. 40 is a diagram for illustrating the distribution of light emitted from the light source.
Figure 41:
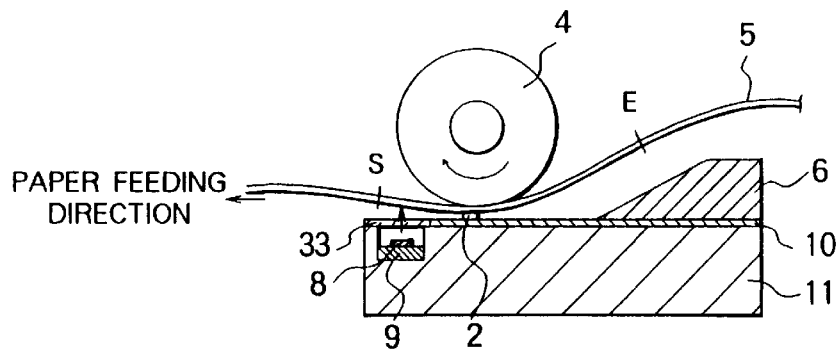
FIG. 41 is a diagram for illustrating how recording paper is conveyed in another example of the recording apparatus of the present invention.
Figure 42:
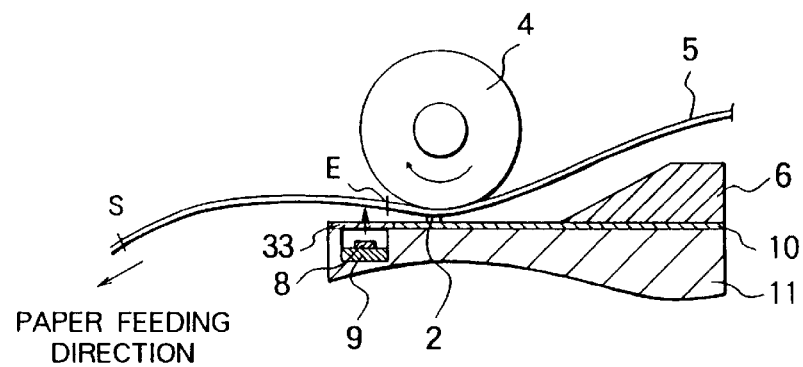
FIG. 42 is a diagram for illustrating how recording paper is conveyed in another example of the recording apparatus of the present invention.

The distribution of the quantity of light emitted from this light source is as illustrated in FIG. 39. As is seen from the graph of FIG. 39, uniform quantity of light is obtained at the positions J-K on the top glass plate 41. Further, at the positions L-M on the top glass plate 41, there occurs no light emission between the opposite transparent electrodes 42, as illustrated in a graph of FIG. 40. However, uniform quantity of light is obtained on the surface of the transparent electrodes 42. This uniformity of quantity of light is due to the similar linear patterns of the opposite transparent electrodes. Therefore, the quantity of light is uniform in the direction in which the linear patterns of the transparent electrodes are formed. Thus, it is found that such a plasma light emitting light source is suitable for a uniform planar light emitting light source.

In the case of the recording apparatus in which this light emitting light source is used as the light emitting device and in which the heating elements are placed in such a way that the direction from J to K of FIG. 39 is parallel to the arrangement line of the heating elements, the optical fixing is performed on the thermosensitive paper of the optical fixing type above the top glass plate 41 of the plasma light emitting light source after parts of the recording paper are selectively colored on the line of the arranged heating elements. Incidentally, this plasma light emitting light source, the pattern arrangement, the material and the configuration and the mixed-gas composition are not limited to those as described hereinabove. As long as uniform planar light emission can be obtained by plasma light emission techniques, by which a high voltage is developed across the laterally symmetric linear pattern, other configurations and so on may be employed. Additionally, in the case of the conventional lamp, mercury gas, which is hard to treat, is employed as the mixed gas. In contrast, in the case of utilizing this plasma light emission technique, there is no necessity of using mercury (gas).

Thus, the recording apparatus of this embodiment has the aforementioned configuration, so that uniform quantity of light can easily be obtained. Further, the light emitting face is flat. Thus, the conveyance of the recording paper can easily be carrier out. Moreover, it is unnecessary to use mercury which is difficult to use.

EMBODIMENT 11

FIGS. 41 to 44 are diagrams for illustrating how recording paper is conveyed in another example of the recording apparatus of the present invention. Namely, FIGS. 41 to 44 illustrate the steps of a process of conveying the recording paper according to the present invention in sequence. As viewed in FIGS. 41 and 42, the recording paper 5 is conveyed from the right to the left, similarly as in the case of the conventional apparatus. Incidentally, in these figures, reference character S denotes a start position at which the coloring and recording are started; and E an end position at which the coloring and recording are finished. Meanwhile, the (optical) fixing is performed by using light, which is emitted from the light emitting devices 8 serving as the light emitting meas, on the recording paper 5 colored above the arrangement line of a plurality of heating elements 2.

Figure 43:
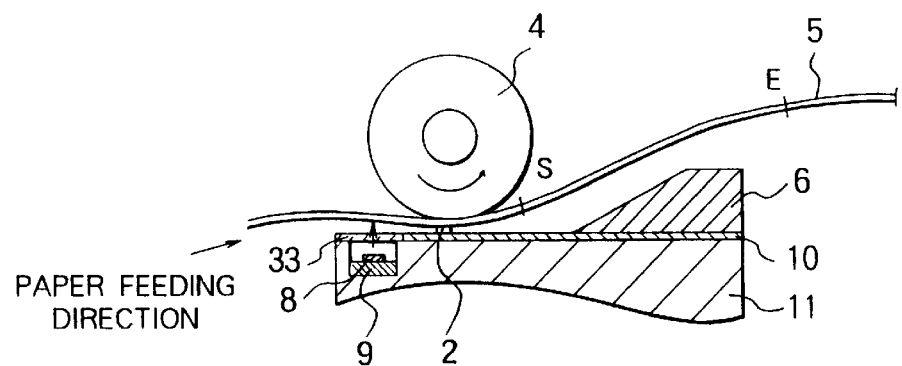
FIG. 43 is a diagram for illustrating how recording paper is conveyed in another example of the recording apparatus of the present invention.
Figure 44:
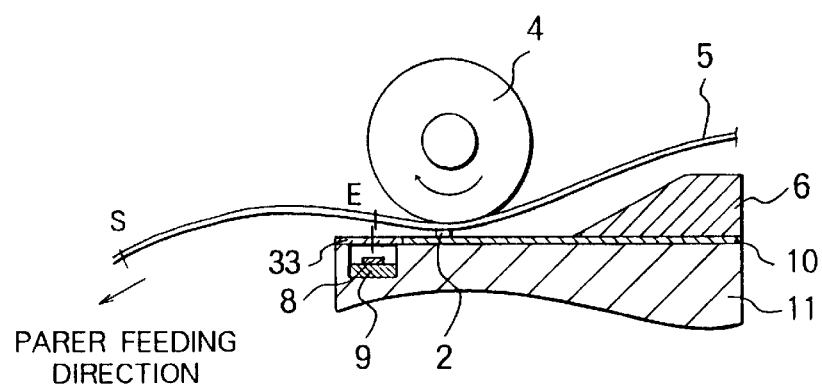
FIG. 44 is a diagram for illustrating how recording paper is conveyed in another example of the recording apparatus of the present invention.

Thereafter, as viewed in FIG. 43, the recording paper 5 is put back to the right in a state in which the heating elements 2 are not driven and only the light emitting devices 8 are driven. Subsequently, as viewed in FIG. 44, the recording paper 5 is conveyed to the left in a state in which only the light emitting devices 8 are driven. Thereby, light is emitted three times by the light emitting devices 8 onto the recording paper 5. Therefore, even if the number of the light emitting devices is reduced, the shortage of the quantity of emitted light never occurs.

The operation of conveying or feeding the recording paper may be performed as follows. Namely, first, the recording paper 5 is caused to go back at a low speed after the coloring and recording operations are performed at a high speed by driving the heating elements 2. Further, during this, the optical fixing is performed by using light emitted from the light emitting devices 8. Thereafter, the recording paper is fed forward at a high speed.

In the case of the recording apparatus of this embodiment, after the coloring and recording are performed by heat emitted from the heat emitting elements during conveying the recording paper, the recording paper is fed in the opposite direction onto the light emitting devices. Thereby, a recording paper conveying time, in which the recording paper is conveyed above the light emitting devices during light is emitted therefrom, can be lengthened. Thereby, a larger quantity of light for fixing can be gained. Moreover, the shortage of the quantity of light emitted from the light emitting device can be made up for.

EMBODIMENT 12

Figure 45:
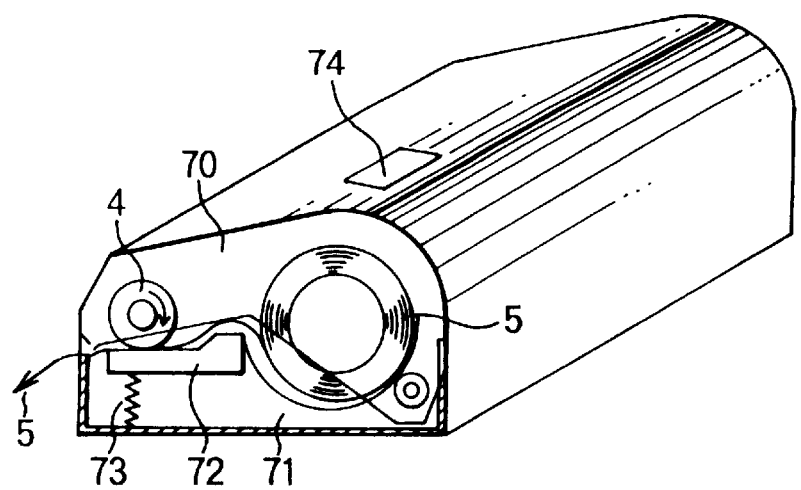
FIG. 45 is a partially cutaway perspective diagram for illustrating another example of the recording apparatus of the present invention.

FIG. 45 is a partially cutaway perspective diagram for illustrating another example of the recording apparatus of the present invention. As shown in this figure, the cover 70 and the chassis 71 compose the housing of the recording apparatus. The cover 70 is attached to the chassis 71 in such a manner as to be able to be opened and closed. Further, the recording paper conveying platen roller 4 is attached to the cover 70. On the other hand, a recording head 72 is placed in the chassis 71. Further, the recording paper 5 wound like a roll is enclosed in the chassis 71. Moreover, the recording paper 5 drawn out of the roll is put through a space between the recording head 71 and the platen roller 4. The recording head 72 is pushed against the platen roller 4 by a spring 73.

The cover 70 has an opening at a position, at which the roll-like recording paper 5 can be visually checked, and has a colored filter 74 for blocking off only light, whose wavelength is equal to the absorption wavelength of the recording paper 5. The colored filter 74 blocks off the light of the wavelength ranging from 400 nm to 500 nm.

In the case of this embodiment, the colored filter 74 is provided in an opening of the cover 70. As previously illustrated in FIG. 33, the recording paper of the optical fixing type does not cause a chemical reaction even when light having a wavelength other than the absorption wavelength of the recording paper is present. Namely, if blocking off the light of the absorption wavelength ranging from 400 nm to 500 nm, there occurs no reaction in the recording paper. Therefore, the remaining quantity of the recording paper wound like a roll can be visually checked by being provided with the colored filter 74 for blocking off only the light of the absorption wavelength, similarly as in the case of this embodiment.

Furthermore, a user can know a time at which the recording paper 5 should be replaced. Thus, the recording paper 5 can be replaced before the recording paper 5 is used up. Thereby, the reliability of the recording apparatus can be prevented from being deteriorated owing to the shortage of the recording paper.

In the case of the recording apparatus of this embodiment, the colored filter for blocking off at least the light of the absorption wavelength of the recording paper is provided. Thereby, the remaining quantity of the thermosensitive paper in the recording apparatus can be visually checked.

EMBODIMENT 13

Figure 46:
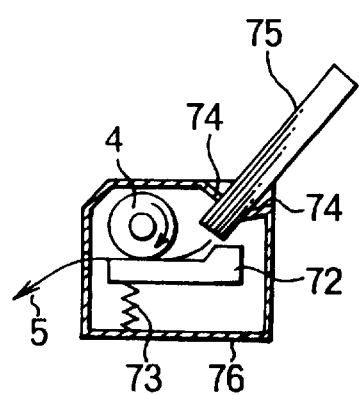
FIG. 46 is a sectional view of another example of the recording apparatus of the present invention.

FIG. 46 is a sectional view of another example of the recording apparatus of the present invention. As shown in this figure, the platen roller 4, which is used for conveying the recording paper 5, and a recording head 72 are provided in the chassis 76. Further, the spring 73 for pushing the recording head 72 against the platen roller 4 is placed therein.

Furthermore, for example, a thin rubber-plate-like shielding (or shading) member 74 is provided in an insertion portion, into which a recording paper cassette 75 is inserted, of the chassis 76. Incidentally, thermosensitive paper of the optical fixing type, which is cut to prescribed dimensions, is inserted into the recording paper cassette 75.

As shown in this figure, the recording paper 5 is enclosed in the recording paper cassette 75 for blocking off external light. Further, a sheet of the recording paper 5 is drawn out of the cassette at a time. In the case of such a recording apparatus, it is necessary to preventing the recording paper 5 contained in the recording apparatus from being exposed to external light entering through an inlet port, from which the cassette 75 is inserted. In the case of this embodiment, elastic external-light blocking member 74 is used as a inlet port from which the recording paper cassette is inserted. Thereby, external light is prevented from entering through the inlet port 75 from which the cassette 75 is inserted.

EMBODIMENT 14

Figure 47:
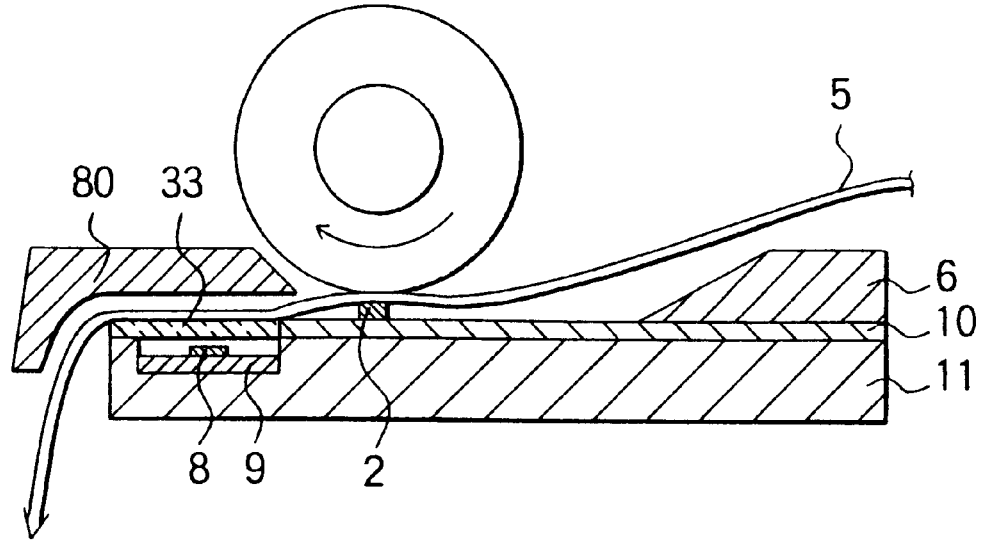
FIG. 47 is a sectional view of a primary part of another example of the recording apparatus of the present invention.

FIG. 47 is a sectional view of a primary part of another example of the recording apparatus of the present invention. As shown in this figure, a transparent plate 33 is provided on the light emitting device 8. Further, a recording paper guide 80 for guiding recording paper 5 is placed at a position, at which the guide 80 faces the transparent plate 33, in front of a platen roller 4 in a direction in which the recording paper is ejected.

In the case of this embodiment, operations of coloring and fixing an image on the recording paper 5 are similar to those of the aforementioned Embodiment 17. Thus, the descriptions of such operations are omitted herein. The recording paper 5 conveyed by the platen roller 4 is guided by the recording paper guide 80 to the bottom surface of the supporting base 11. Therefore, in the case of the recording apparatus of Embodiment 14, the recording paper 5 is guided by the recording paper guide 80. Thereby, the recording paper 5 can be reliably conveyed onto the light emitting device 8 serving as the light emitting means. Consequently, the fixing of an image on the recording paper can be reliably performed.

Furthermore, a sponge-like elastic member is provided at a position above the light emitting device 3, as the recording paper guide 80. Thereby, the recording paper 5 can be made to adhere closely to the light emitting device 8.

EMBODIMENT 15

Figure 48:
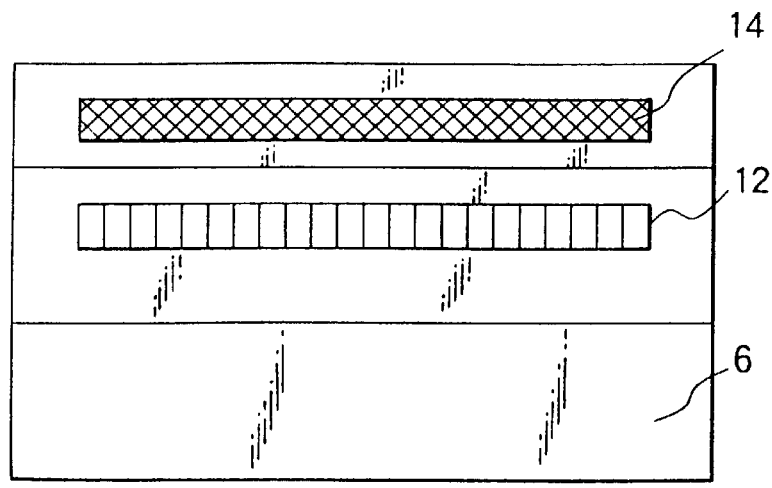
FIG. 48 is a plan view of a primary part of another example of the recording apparatus of the present invention.
Figure 49:
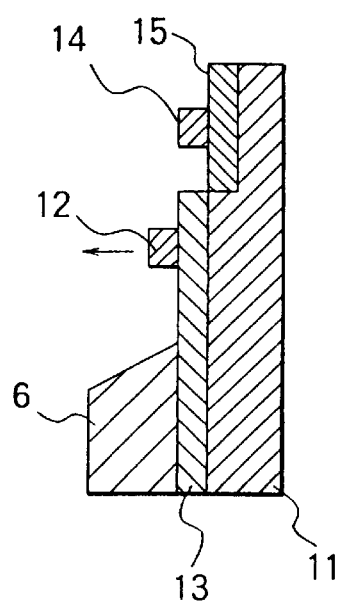
FIG. 49 is a sectional view of the primary part of FIG. 48.

FIG. 48 is a plan view of a primary part of another example of the recording apparatus of the present invention. FIG. 49 is a sectional view of the primary part of FIG. 48. As shown in FIG. 48, a circuit component configuration portion 6, which is the same as of the aforementioned Embodiment 1, is provided on a light emitting board 13 fixed on a supporting base 11. Moreover, a plurality of light emitting devices 12 serving as the light emitting means are provided on the light emitting board 13. Furthermore, a heating board 15 is fixed on the supporting base 11, in which the heating means 14 is placed in such a manner as to be parallel to the arrangement line of the light emitting devices 12.

Figure 50:
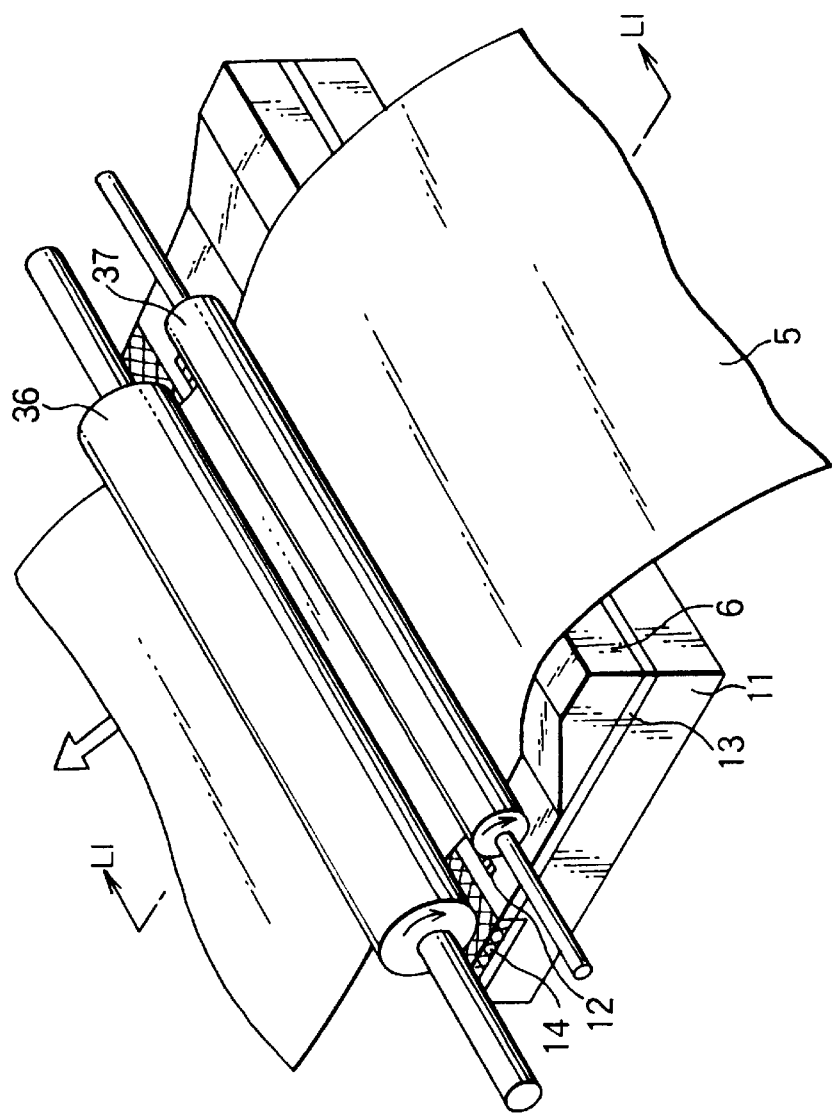
FIG. 50 is a perspective diagram for illustrating how recording paper is conveyed in the recording apparatus of the present invention.
Figure 51:
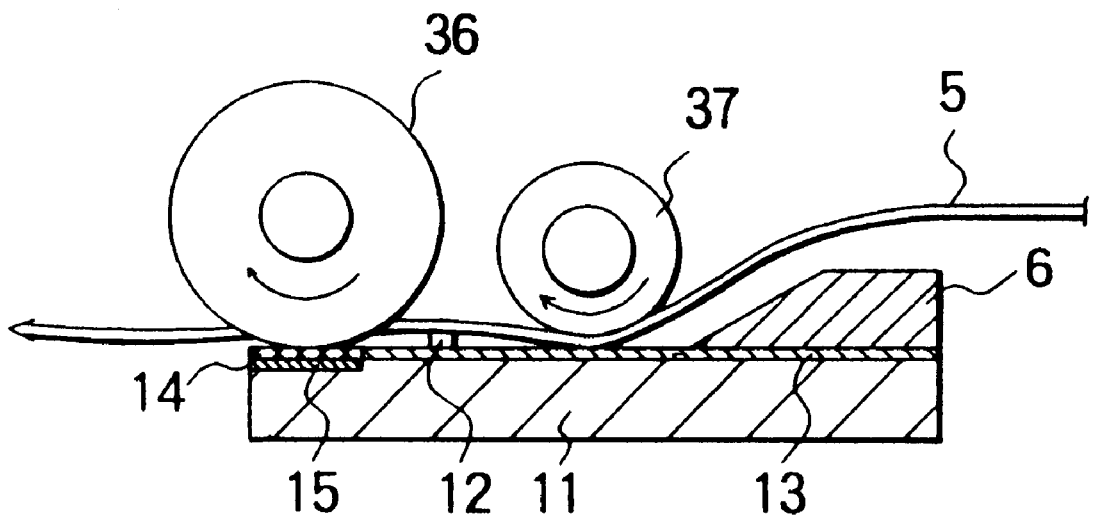
FIG. 51 is a sectional view of the light emitting means taken in the direction of arrows along line LI—LI of FIG. 50.

FIG. 50 is a perspective diagram for illustrating how recording paper is conveyed in the recording apparatus of the present invention. FIG. 51 is a sectional view of the light emitting means taken in the direction of arrows along line LI—LI of FIG. 50. As shown in FIG. 50, the plurality of light emitting devices 12 are arranged on the supporting base 11. The light emitting devices 12 are light emitting diodes. Further, the heating means 14 is provided on the supporting base 11. The heating means 14 is, for example, a planar film-like heater. A heating means platen roller 36 is provided on the heating means 14. Further, a conveying platen roller 37 is placed upstream of the plurality of light emitting devices 12. The recording paper 5, which is thermosensitive paper of the optical fixing type, conveyed over the light emitting devices 12 and the heating means 14 by means of the conveying platen roller 37 and the heating means platen roller 36.

In the case of this embodiment, the plurality of arranged light emitting devices 12 are first selectively driven. Thereby, light is selectively emitted and irradiated from the devices 12 in such a manner that the optical density of unrecorded parts is 0.2. Thus, the fixing is performed on the recording paper 5. Thereafter, (optically) unfixed parts are colored by heat emitted from the heating means 14. Thus, the platen roller 36 provided on the heating means 14 is adapted to push the recording paper 5 against the heating means 14.

In the case of this embodiment, the conveyance of the recording paper can be performed by maintaining the planar state of the recording paper. Moreover, with such a configuration, the integration of the electronic components can be achieved. Consequently, the replacement of a component in the recording apparatus can be facilitated.

EMBODIMENT 16

Figure 52:
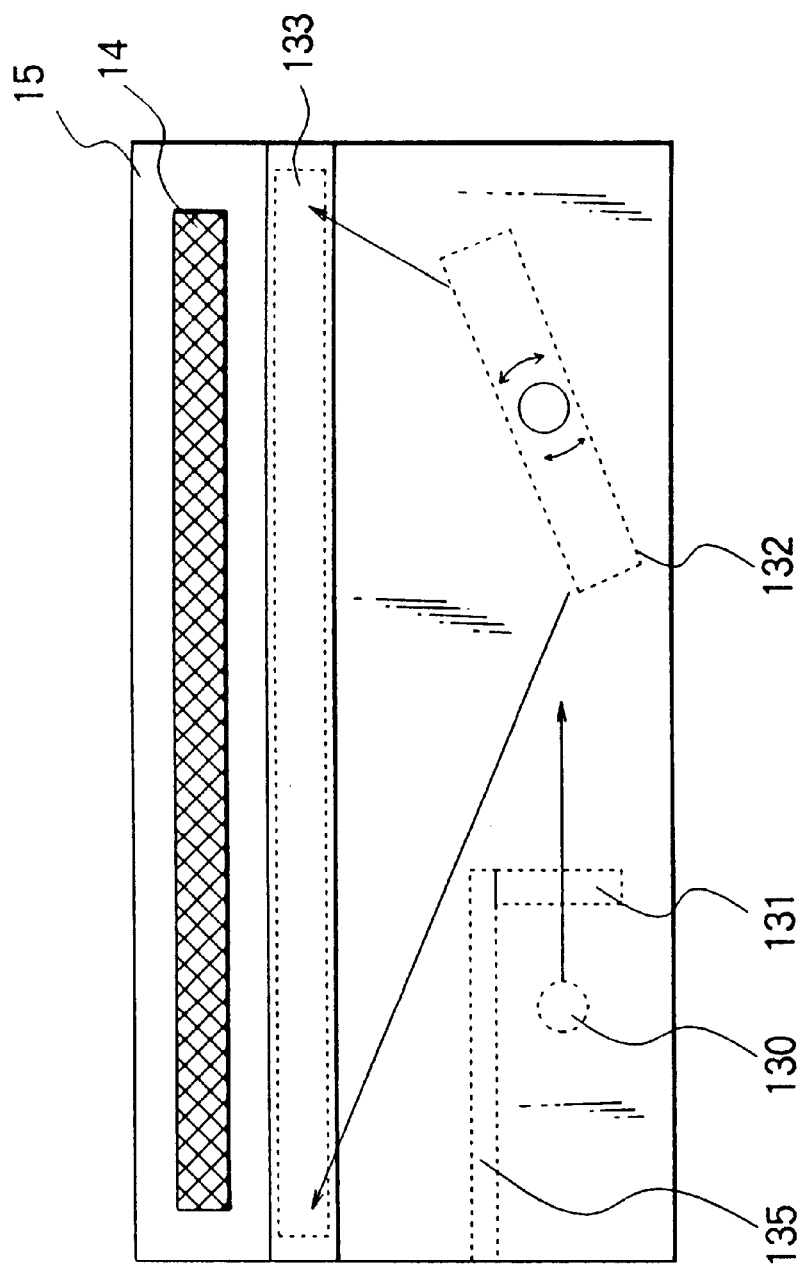
FIG. 52 is a partially cutaway perspective diagram for illustrating another example of the recording apparatus of the present invention.
Figure 53:
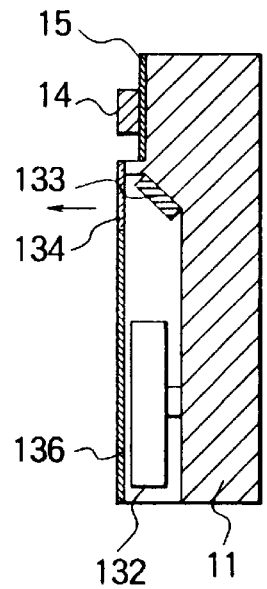
FIG. 53 is a sectional view of the recording apparatus of the present invention of FIG. 52.

FIG. 52 is a partially cutaway perspective diagram for illustrating another example of the recording apparatus of the present invention. FIG. 53 is a sectional view of the recording apparatus of the present invention of FIG. 52. As shown in these figures, a light emitting device 130, which is, for instance, a laser diode, is fixed onto the supporting base 11. The light emitting device 130 is operative to irradiate light in the direction of an arrow drawn from the light emitting device 130. Moreover, a light slit plate 131, which further serves as a condensing means for condensing light emitted from the device 130, is placed in the apparatus in the direction in which light is irradiated from the light emitting device 130.

Furthermore, a mirror 132, which is a rotatable reflection plate for reflecting the condensed light, is provided downstream of the light slit plate 131. In addition, a reflection mirror 133 for further reflecting the light, which has been reflected by the rotatable mirror 132, in a direction perpendicular to a direction, in which the recording paper is conveyed, is provided downstream of the mirror 132. A transparent plate 134, which is operative to transmit the reflected light and serves as a recording-paper conveying platform and is made of, for instance, glass, is fixed therein above the reflection mirror 133. A shielding member 135 for blocking off unnecessary irradiation from the light emitting device 130 is provided above the light emitting device 130 as viewed in FIG. 52. Further, the light emitting devices and the reflection portions such as the light emitting device 130, the light slit plate 131, the rotatable mirror 132 and the reflection mirror 138 are covered with a cover 136. Moreover, a heating board 15, on which the heating means 14 is placed in such a manner as to be parallel to irradiation positions on the printing paper 5 irradiated with light coming from the light emitting device 130, is fixed onto the supporting base 11.

Next, an operation of this embodiment will be described hereinbelow. As shown in FIG. 51, light emitted from the light emitting device 130 is condensed by the light slit plate 131. Then, a direction, in which the light is irradiated, is changed by the rotatable mirror 132 into a direction perpendicular to the direction in which the recording paper is conveyed or fed. The recording of data in the direction of the width of the recording paper is performed by changing the angle of (rotation of) the rotatable mirror 132. Furthermore, the reflected light is further reflected by the reflection mirror 133, so that the direction of the irradiation is changed to the recording paper. Then, the reflected light is transmitted by the transparent plate 134 and is further irradiated on the recording paper. Furthermore, unrecorded parts are selectively irradiated with light by permitting or inhibiting the light emission of the light emitting device 130 during changing the angle of rotation of the mirror 132. Thus, the fixing is performed on the recording paper. Thereafter, unfixed parts thereon are colored by heat emitted from the heating means 14.

In the case of the recording apparatus of this embodiment, there is provided only one light emitting device 130, which serves as the light source. Thus, the cost of the recording apparatus can be reduced. Moreover, the light condensed by the light slit plate 131 is applied onto the recording paper, so that the resolution of the recording apparatus can be enhanced.

In the case of this embodiment, light emitted from the light emitting device 130 is condensed by the light slit plate 131. However, the light may be condensed by a combination of lenses or the like. Alternatively, a filter, which transmits only light of a specific wavelength, may be used. Incidentally, the resolution concerning the information recorded on the recording paper can be determined by a condensing portion. Further, the resolution concerning the record on the recording paper can be changed by modifying or changing the light slit plate 131. Furthermore, in the case of this embodiment, the rotatable mirror 132 and the reflection mirror 133 are used. However, instead of these mirrors, a reflection mirror being capable of moving parallel to itself in a direction perpendicular to the direction, in which the recording paper is conveyed, may be used.

EMBODIMENT 17

Figure 54:
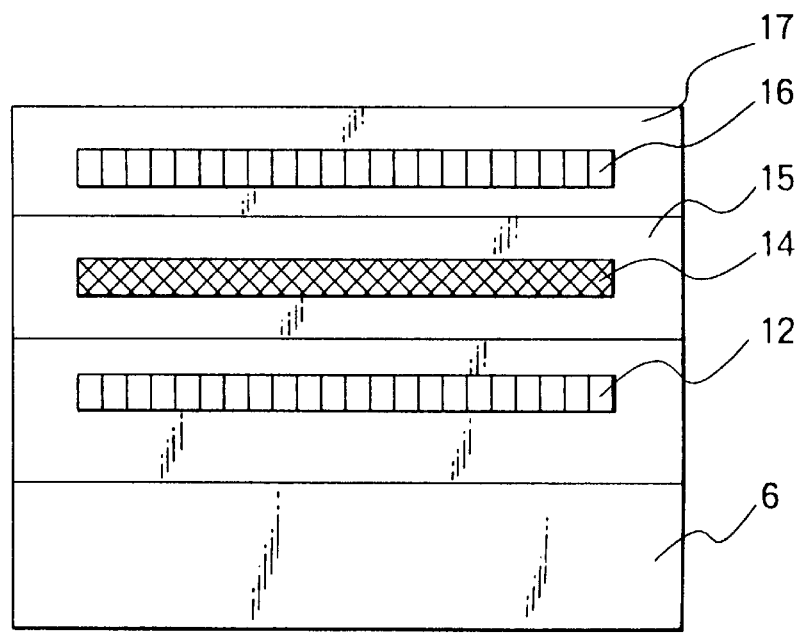
FIG. 54 is a plan view of a primary part of another example of the recording apparatus of the present invention.
Figure 55:
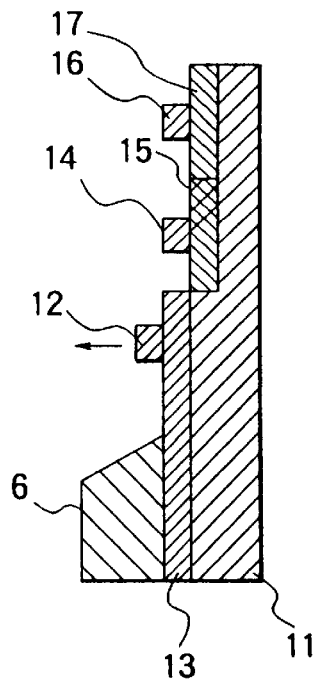
FIG. 55 is a sectional view of the primary part of FIG. 54.

FIG. 54 is a plan view of a primary part of another example of the recording apparatus of the present invention. FIG. 55 is a sectional view of the primary part of FIG. 54. As shown in these figures, a light receiving element board 17, on which a plurality of light receiving devices or elements 16 are disposed in such a way as to be parallel to the arrangement line of the light receiving elements or devices 12, is placed on a supporting base 11. The light receiving elements 16 are connected to an interpreting or reading device (not shown). The remaining composing elements of Embodiment 17 are similar to the corresponding composing elements of Embodiment 15.

In the case of Embodiment 17, operations of coloring and fixing an image on the recording paper 5 are similar to those of the aforementioned Embodiment 15. Thus, the descriptions of such operations are omitted herein. The recording paper 5, on which the fixing and recording have been performed, passes over the arrangement line of the light receiving elements 16. Further, when the recording paper 5 passes over the light receiving elements 16, a result of the recording is read by the light receiving elements 16. Then, such a record is interpreted or read by an interpreting means (not shown). Namely, the reading of the result of the recording can be performed when the recording paper is conveyed. Thus, the reliability of the recording apparatus can be enhanced. Moreover, the light receiving element or device 16 may be used as a detection device for detecting whether or not the recording paper 5 is present. Furthermore, a failure in recording, which is caused by the failure of the heating means 14 or the light emitting device 12, can be thus checked.

In the case of the recording apparatus of this embodiment, the recording paper passes over the arranged light receiving elements 16. Further, the result of the recording, which is fixed on the recording paper, is read by the light receiving elements 16, so that the reliability of the recording apparatus can be enhanced.

EMBODIMENT 18

Figure 56:
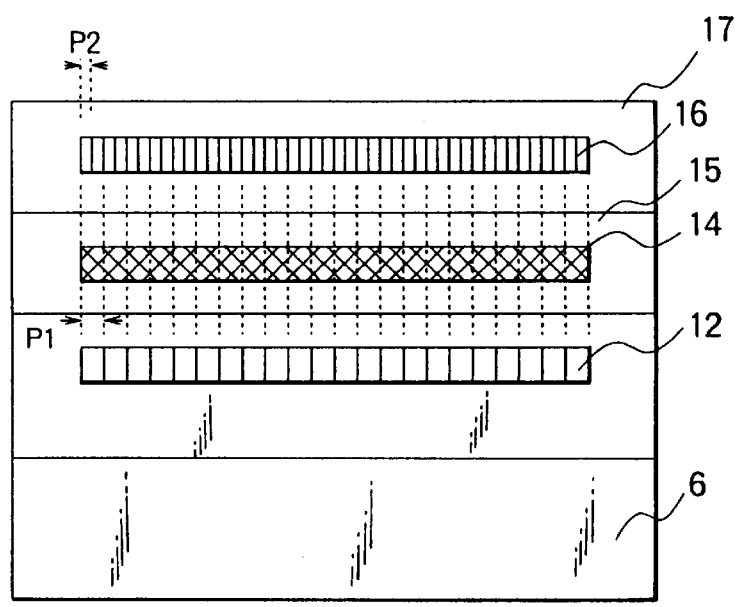
FIG. 56 is a plan view of a primary part of another example of the recording apparatus of the present invention.
Figure 57:
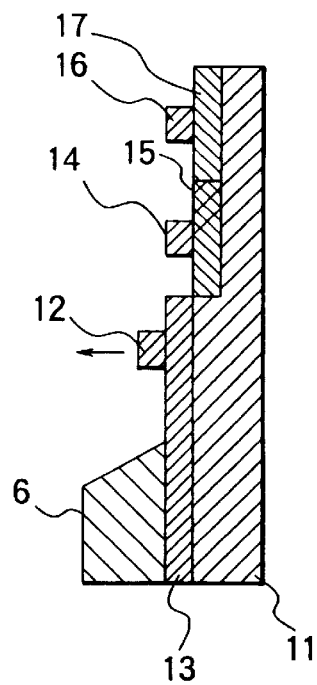
FIG. 57 is a sectional view of the primary part of FIG. 56.

FIG. 56 is a plan view of a primary part of another example of the recording apparatus of the present invention. FIG. 57 is a sectional view of the primary part of FIG. 56. As shown in these figures, a plurality of light receiving devices or elements 16 are arranged in a line at an arrangement pitch P1. Further, the plurality of light receiving devices or elements 16 are arranged in a line at an arrangement pitch P2, which is not more than the pitch P1 for the light emitting elements 12 serving as the light emitting means, in such a way that the arrangement line of the light receiving elements 16 is parallel to that of the light emitting devices or elements 12. The remaining composing elements of Embodiment 18 is similar to the corresponding composing elements of Embodiment 17.

Because the arrangement pitch P2 of the light receiving elements 16 is set as being equal to or less than the arrangement pitch P1 of the heating means 12, a light receiving element board 7 can easily be placed and fabricated on the supporting base 11 by disregarding the arrangement pitch of the heating elements 2 of the heating element board 10 when fabricating the recording apparatus.

In the case of the recording apparatus of Embodiment 18, the arrangement pitch of the light receiving elements 16 is set as being equal to or less than the arrangement pitch of the plurality of the arranged heating elements 12. Thus, the fabrication of the apparatus can be facilitated only by carefully handling the arrangement lines of the light receiving elements 16 and the heating elements 12 in such a way that these lines of the elements 16 and 12 are parallel with each other.

EMBODIMENT 19

Figure 58:
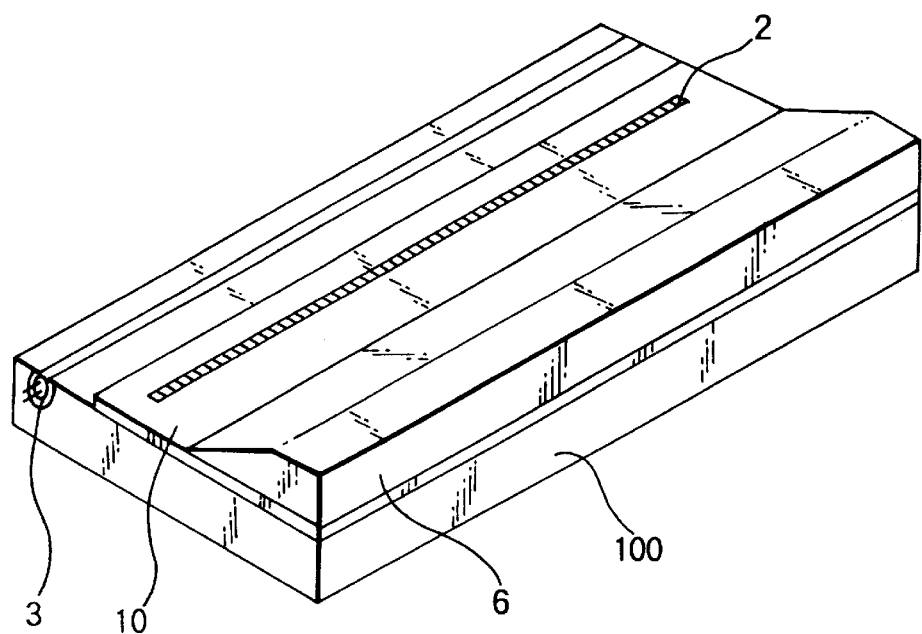
FIG. 58 is a perspective view of a primary part of another example of the recording apparatus of the present invention.

FIG. 58 is a perspective view of a primary part of another example of the recording apparatus of the present invention. A plurality of heating elements 2 are placed on a heating element board 10 that is fixed onto the supporting base 100 constituted by an aluminum extruding material. Further, a circuit component configuration portion 6 is provided on the heating element board 10. Moreover, a lamp 3 serving as the light emitting means, which is placed in such a manner as to be parallel to the arrangement line of a plurality of heating elements 2, is provided on the supporting base 100. The supporting base 100 is formed by extruding aluminum from an extruding dye or mold having a hole, whose section has a shape like a section of the supporting base 100. A round groove 35 formed when extruding aluminum is provided in an end or edge portion of the supporting base. The lamp 3 is put in this round groove 35.

Figure 59:
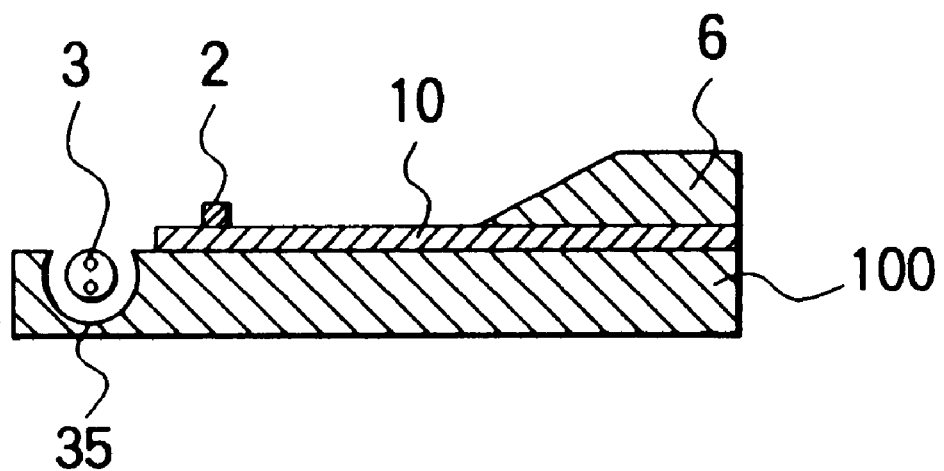
FIG. 59 is a side view of the primary part of FIG. 59.
Figure 60:
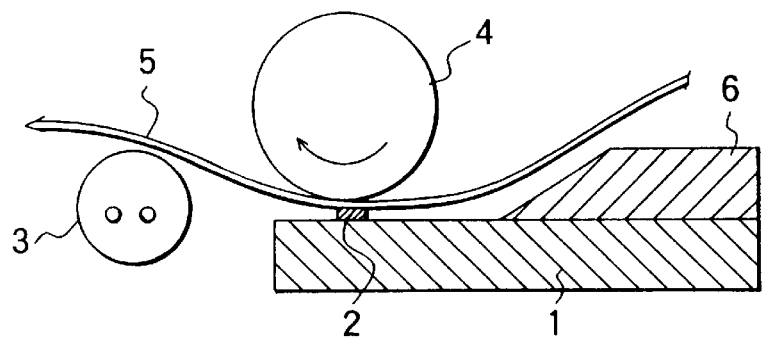
FIG. 60 is a sectional view of a conventional recording apparatus.
Figure 61:
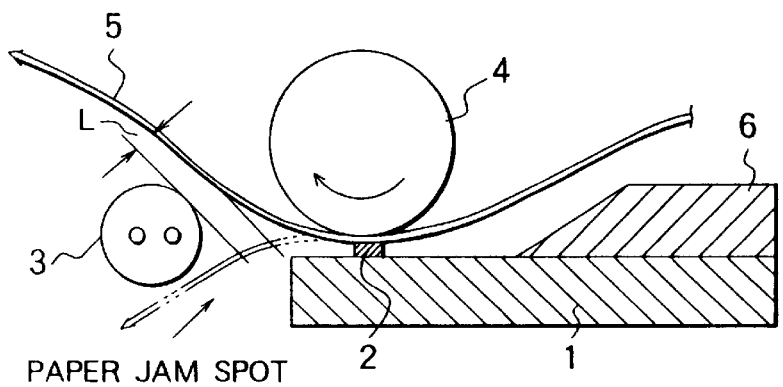
FIG. 61 is a sectional view of another conventional recording apparatus.
Figure 62:
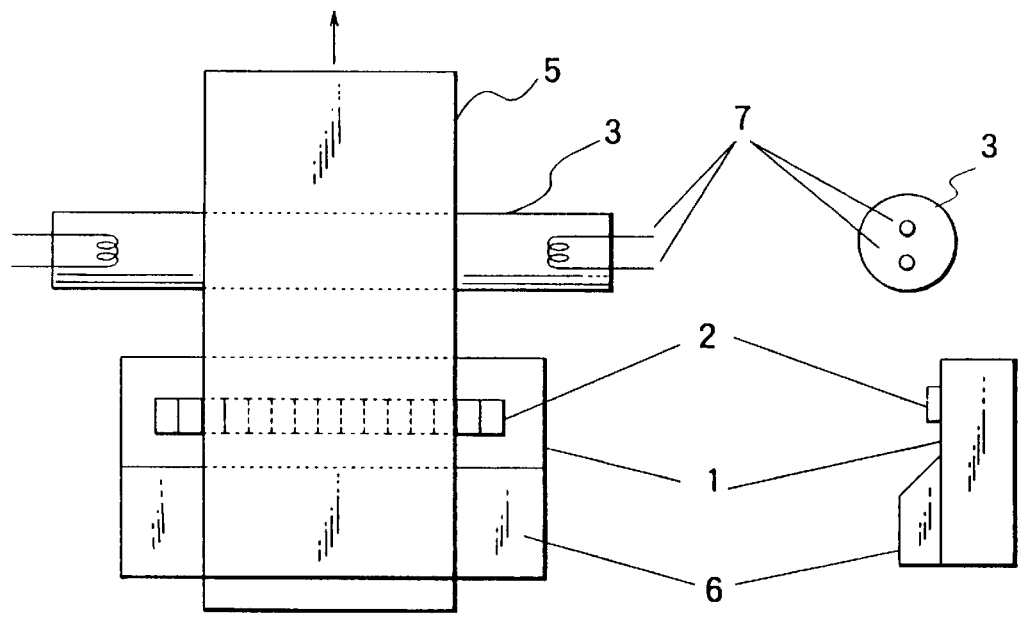
FIG. 62 is a diagram for illustrating a top view of the conventional recording apparatus that is in a state in which the platen roller is removed therefrom, and for illustrating the placement of a thermal head and a lamp in the conventional recording apparatus.
Figure 63:
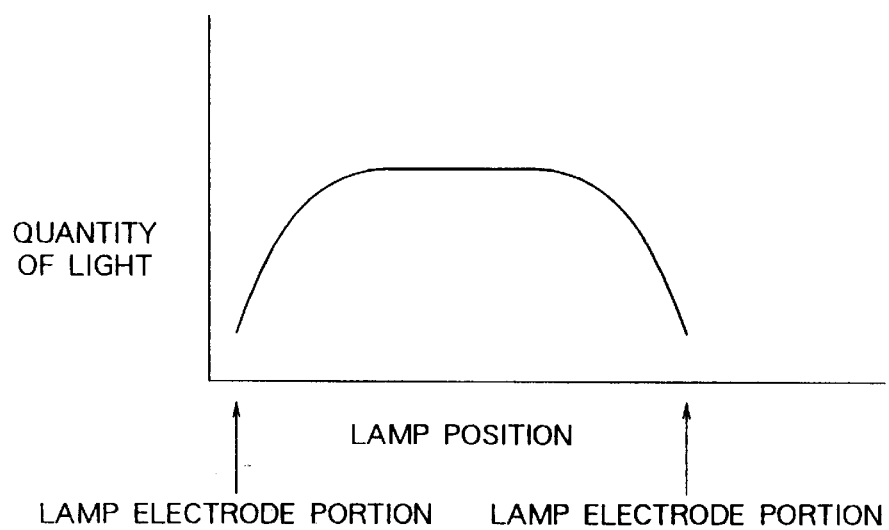
FIG. 63 is a graph for illustrating the distribution of quantity of light of the lamp of the conventional recording apparatus.
Figure 64:
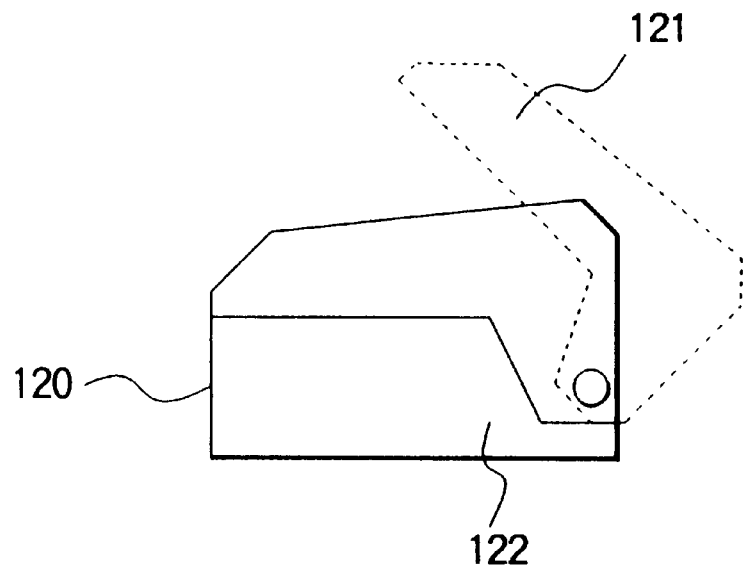
FIG. 64 is a diagram for illustrating operations of opening and closing the cover of another example of the conventional recording apparatus.
Figure 65:
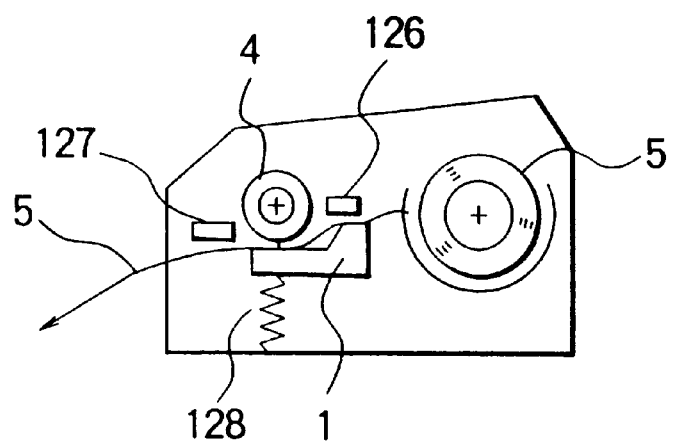
FIG. 65 is a diagram for illustrating the placement of components in the conventional recording apparatus.
Figure 66:
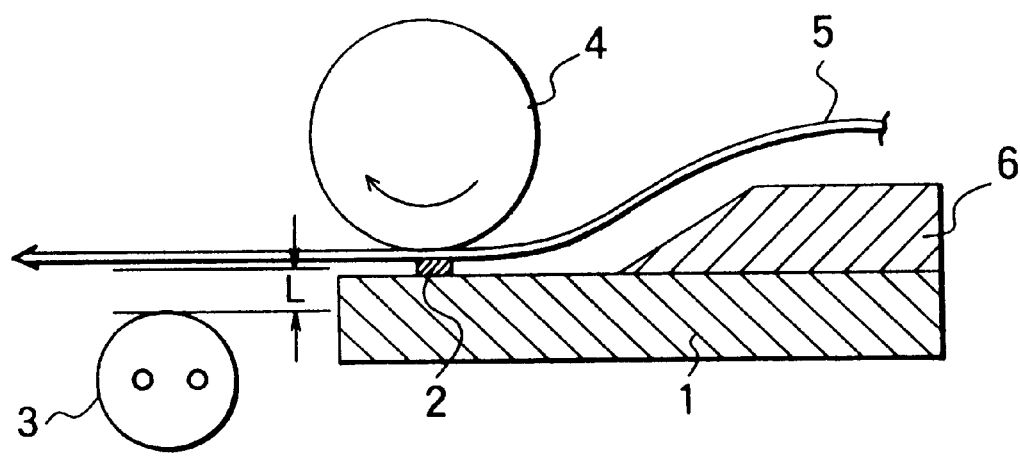
FIG. 66 is a diagram for illustrating another example of the conventional recording apparatus in which the spacing between the lamp and the recording paper is enlarged.

In the case that the lamp 3 of FIG. 58 having a circular section is fixed in the supporting base, the section of a groove bored in the supporting base, at positions where the lamp 3 is supported, are shaped in a circular form. In this case, if the size of the supporting base in the direction of the length thereof (namely, the direction of the width of the recording paper) is short, round hole processing can be performed in the direction of the length thereof, namely, a round hole can be made by cutting the side surface thereof. Thus, the supporting base having a section as shown in a side view of FIG. 59 can be produced. However, in the case of a long electronic component on which the plurality of heating elements 2 are arranged, round hole processing cannot be achieved with high accuracy by using the aforementioned processing method. When forming such a supporting base having a round part, a section dye having a section as shown in the side view is first produced. Then, softened aluminum is extruded by using the section dye. Subsequently, the extruded aluminum is cooled. Thus, the aluminum supporting base 100 having a similar section can be produced with good accuracy by performing such a extruding process.

Furthermore, if the planar processing accuracy of a machining apparatus is not good, the cutting of the top surface of the long supporting base is difficult and a required cutting time is rather long. Thus, the fact is that such a processing is unsuitable for making a long electronic product at a low price. The lamp 3 can be fixed in the supporting base 100 by placing the lamp 3 therein and applying a heat-resistant insulating adhesive agent, for example, a silicone rubber adhesive agent thereto. Further, heat emitted from the lamp 3 is conducted to the supporting base 100. Thus, heat emitted from the lamp 3, which is the problem of the prior art, can be restrained. Further, the distance between the lamp 3 and the recording paper can be reduced to a value shorter than that of the prior art. Incidentally, aluminum is a metallic material, and thus is a heat conductive material. Thus, part of heat emitted from the heating elements 2 and the lamp 3, which does not contribute to the recording, can be radiated. Further, in the case where the radiation of heat is further needed, the bottom surface of the aluminum supporting base 100 may be shaped into a form, by which the radiation of heat is facilitate and the area of a section is increased. Alternatively, for the purpose of enhancing the effects of radiating heat, black alumite processing may be performed thereon just after extruding aluminum. Further, in some cases, the supporting base 100 may be cooled from the bottom thereof by using a fan or the like.

In the case of the recording apparatus of this embodiment, the supporting base 100 is produced by using an extruded aluminum material. Thus, the lamp can be restrained from emitting heat. Moreover, the distance between the lamp and the recording paper can be made to be smaller than that in the case of the conventional recording apparatus. Furthermore, the conveyance of the recording paper can be performed by maintaining the planar state of the recording paper. As a result, no paper jam can occur. Additionally, as a consequence of making the supporting base by performing the extruding process, the base having a sectional shape like a round groove, which is hard to process from the top surface thereof, can easily be realized.

Although the preferred embodiments of the present invention have been described above, it should be understood that the present invention is not limited thereto and that other modifications will be apparent to those skilled in the art without departing from the spirit of the invention.

The scope of the present invention, therefore, should be determined solely by the appended claims.

What is claimed is:

1. A recording apparatus for thermally developing color in thermosensitive, optically fixed recording paper, and optically fixing the thermosensitive, optically fixed recording paper, said apparatus comprising:

a housing for blocking off external light;

a supporting base placed within the housing;

a heating element board fixed to a first portion of said supporting base; and a light emitting board fixed to a second portion of said supporting base, a direction from said heating element board to said light emitting board defining a direction of travel and a path of the recording paper;

said heating element board comprising an array of selectively energized heating elements positioned in a row normal to the path of the paper for selectively applying heat to color a portion of paper in registration with a heating element;

said light emitting board comprising an array of light emitting elements disposed across the width of the paper.

2. The recording apparatus according to claim 1, wherein the light emitting elements are light emitting diodes.

3. The recording apparatus according to claim 2, further comprising:

a guide member provided in the supporting base; a substrate supporting said light emitting board and mounted on the supporting base within the guide member to be guided by the guide member and move in a direction perpendicular to a direction in which recording paper is conveyed or fed; and a moving mechanism, mounted on the supporting base, for moving the substrate in a reciprocal manner.

4. The recording apparatus according to claim 2, wherein the light emitting diode is a light emitting diode having a SiC substrate.

5. The recording apparatus according to claim 2, wherein driving potential of the light emitting diode is selected to be equal to that of each of the heating elements.

6. The recording apparatus according to claim 1, wherein the light emitting means comprises: a sealed container, a surface of which is a glass plate; a pair of electrodes placed on an inner surface of the glass plate of the sealed container; and a fluorescent element provided in the container to face the glass plate, wherein the container is filled with inert mixed gas, and wherein the glass plate faces the recording paper.

7. The recording apparatus according to claim 1, wherein the supporting base comprises an aluminum extrusion, wherein the supporting base has a groove extending in the direction of width of recording paper, and wherein the light emitting means is a lamp put in the groove.

8. The recording apparatus according to claim 1, wherein a transparent plate is placed between the light emitting means and the recording paper.

9. The recording apparatus according to claim 1, further comprising: a plurality of light receiving elements arranged in the direction of width of recording paper downstream of the heating elements in the direction of travel of the recording paper; and an interpreting device electrically connected to the light receiving elements.

10. The recording apparatus according to claim 9, wherein an arrangement pitch of the plurality of light receiving elements is not more than an arrangement pitch of the plurality of heating elements.

11. The recording apparatus according to claim 9 wherein light is detected by the light receiving elements in accordance with whether or not recording paper is present.

12. The recording apparatus according to claim 9, wherein light is detected by the light receiving elements in accordance with whether the housing is opened or closed.

13. The recording apparatus according to claim 11, wherein a condensing member is placed between the light emitting means and recording paper.

14. The recording apparatus according to claim 1, wherein the housing has an opening at a place where recording paper is able to be visually checked, wherein a filter for blocking off at least light having a wavelength which is a fixing wavelength of the recording paper, is provided at the opening.

15. A recording apparatus for recording on thermosensitive, optically fixed recording paper comprising:

a housing for blocking off external light;

a supporting base provided in the housing;

a plurality of heating elements, arranged on the supporting base in a direction of width of recording paper, for coloring the recording paper;

a laser diode placed in the housing;

a reflection plate, placed in the housing, for reflecting light emitted from said laser diode for scanning the recording paper with the reflected light in a direction of width of the recording paper for fixing selected portions of the recording paper prior to recording;

an array of light emitting elements supported to said supporting base for providing light in a pattern to cure the recording paper over its entire width; and a paper feeding mechanism, placed in the housing, for feeding the recording paper in succession onto the heating elements and over the light emitting means.

16. A recording method for recording on thermosensitive optically cured recording paper having the steps of:

feeding the recording paper in order over a heating element and over light emitting means; and coloring the recording paper by heat produced by the heating element fixing the recording paper a plurality of times by causing the recording paper to perform a reciprocal motion in the proximity of the light emitting means.

17. A recording method for recording on thermosensitive optically cured recording paper having the steps of:

feeding the recording paper in order over a heating element and in proximity to an array of light emitting means; and coloring the recording paper by heat produced by the heating elements and fixing the recording paper by light emitted from the light emitting means, providing a single power supply as a drive power supply for both the heating element and the drive power supply for the light emitting means, and alternately driving one of the heating element and the light emitting means while not driving the other of the heating element and the light emitting means.

* * * * *